(12) United States Patent
Shelnutt et al.

(10) Patent No.: US 10,206,312 B2
(45) Date of Patent: Feb. 12, 2019

(54) LIQUID COOLED RACK INFORMATION HANDLING SYSTEM HAVING STORAGE DRIVE CARRIER FOR LEAK CONTAINMENT AND VIBRATION MITIGATION

(71) Applicant: DELL PRODUCTS, L.P., Round Rock, TX (US)

(72) Inventors: Austin Michael Shelnutt, Leander, TX (US); Travis C. North, Cedar Park, TX (US); Christopher M. Helberg, Austin, TX (US); James Don Curlee, Round Rock, TX (US); Chin-An Huang, Taipei (TW)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 15/049,074

(22) Filed: Feb. 20, 2016

(65) Prior Publication Data

US 2017/0181321 A1    Jun. 22, 2017

Related U.S. Application Data

(60) Provisional application No. 62/270,563, filed on Dec. 21, 2015, provisional application No. 62/270,575, filed on Dec. 21, 2015.

(51) Int. Cl.
*H05K 7/20* (2006.01)
*G06F 1/20* (2006.01)

(52) U.S. Cl.
CPC ....... *H05K 7/20836* (2013.01); *H05K 7/2079* (2013.01); *H05K 7/20763* (2013.01);
(Continued)

(58) Field of Classification Search
CPC ... H01L 23/473; H01L 23/34; H05K 7/20745; H05K 7/20736; H05K 7/20781; H05K 7/1497; H05K 7/2079; H05K 7/20763; H05K 7/20818; H05K 7/20827; H05K 7/20836; H05K 7/20754; H05K 7/20218;
(Continued)

(56) References Cited

U.S. PATENT DOCUMENTS 5,758,607 A    6/1998    Brendel et al.
6,305,463 B1    10/2001    Salmonson
(Continued)

*Primary Examiner* — Adam B Dravininkas
(74) *Attorney, Agent, or Firm* — Isidore PLLC

(57) ABSTRACT

A direct-contact liquid-cooled (DL) Rack Information Handling System (RIHS) includes liquid cooled (LC) nodes having a chassis received in a respective chassis-receiving bay of the rack and containing heat-generating functional components. The LC node configured with a system of conduits to receive direct contact of cooling liquid to regulate the ambient temperature of the node and provide cooling to the functional components inside the node by removing heat generated by the heat-generating functional components. The chassis has a leak containment barrier configured with a trough that underlays a portion of the system of conduits of the LC node and that forms a drain path to a drain port of the chassis. In one or more embodiments, the storage drive carrier has vibration absorbing material that mitigates vibrations of a storage drive placed in the storage drive carrier.

12 Claims, 15 Drawing Sheets

(52) U.S. Cl.
CPC ..... *H05K 7/20772* (2013.01); *H05K 7/20781* (2013.01); *G06F 1/20* (2013.01)

(58) Field of Classification Search
CPC . H05K 7/20627; G06F 1/20; G06F 2200/201; G06F 1/183; G06F 1/206; F25D 21/14; F25D 31/002; F25D 17/00; F24F 13/222
See application file for complete search history.

(56) References Cited

U.S. PATENT DOCUMENTS

| | | | |
|---|---|---|---|
| 6,462,949 B1 * | 10/2002 | Parish, IV | F28D 15/0266 165/80.4 |
| 6,574,104 B2 | 6/2003 | Patel et al. | |
| 6,775,137 B2 | 8/2004 | Chu et al. | |
| 6,798,660 B2 | 9/2004 | Moss et al. | |
| 7,002,799 B2 | 2/2006 | Malone et al. | |
| 7,013,955 B2 | 3/2006 | Phillips et al. | |
| 7,106,590 B2 | 9/2006 | Chu et al. | |
| 7,403,384 B2 | 7/2008 | Pflueger | |
| 7,477,514 B2 | 1/2009 | Campbell et al. | |
| 7,599,184 B2 | 10/2009 | Upadhya et al. | |
| 7,657,347 B2 | 2/2010 | Campbell et al. | |
| 7,944,694 B2 | 5/2011 | Campbell et al. | |
| 7,963,119 B2 | 6/2011 | Campbell et al. | |
| 7,990,709 B2 | 8/2011 | Campbell et al. | |
| 8,035,972 B2 | 10/2011 | Ostwald et al. | |
| 8,077,462 B2 | 12/2011 | Barringer et al. | |
| 8,387,249 B2 | 3/2013 | Campbell et al. | |
| 8,405,975 B2 | 3/2013 | Helberg et al. | |
| 8,422,218 B2 | 4/2013 | Fried et al. | |
| 8,472,182 B2 | 6/2013 | Campbell et al. | |
| 8,516,284 B2 | 8/2013 | Chan et al. | |
| 8,542,489 B2 | 9/2013 | Arney et al. | |
| 8,564,951 B1 * | 10/2013 | Watanabe | H05K 7/20736 165/104.33 |
| 8,583,290 B2 | 11/2013 | Campbell et al. | |
| 8,654,532 B2 | 2/2014 | Chen et al. | |
| 8,749,968 B1 | 6/2014 | Branton | |
| 8,797,740 B2 | 8/2014 | Campbell et al. | |
| 8,824,143 B2 | 9/2014 | Campbell et al. | |
| 8,842,433 B2 | 9/2014 | Koblenz et al. | |
| 8,934,244 B2 | 1/2015 | Shelnutt et al. | |
| 8,938,983 B2 | 1/2015 | Shenzen | |
| 8,959,941 B2 | 2/2015 | Campbell et al. | |
| 8,978,401 B2 | 3/2015 | Chainer et al. | |
| 9,010,141 B2 | 4/2015 | Harrington et al. | |
| 9,045,995 B2 | 6/2015 | Graybill et al. | |
| 9,069,532 B2 | 6/2015 | Campbell et al. | |
| 9,192,074 B2 | 11/2015 | Shibata | |
| 9,250,636 B2 | 2/2016 | Chainer et al. | |
| 9,354,676 B2 | 5/2016 | Shelnutt et al. | |
| 9,386,727 B2 | 7/2016 | Barringer et al. | |
| 9,451,726 B2 | 9/2016 | Regimbal et al. | |
| 9,496,200 B2 | 11/2016 | Lyon et al. | |
| 2003/0128515 A1 | 7/2003 | Faneuf et al. | |
| 2004/0190247 A1 | 9/2004 | Chu et al. | |
| 2004/0221604 A1 | 11/2004 | Ota et al. | |
| 2005/0122685 A1 * | 6/2005 | Chu | H05K 7/2079 361/699 |
| 2005/0248922 A1 | 11/2005 | Chu et al. | |
| 2008/0067805 A1 | 3/2008 | Kamada et al. | |
| 2008/0232064 A1 | 9/2008 | Sato et al. | |
| 2008/0276639 A1 * | 11/2008 | Stoddard | G06F 1/20 62/259.2 |
| 2009/0086428 A1 | 4/2009 | Campbell et al. | |
| 2009/0086432 A1 | 4/2009 | Campbell et al. | |
| 2009/0126909 A1 | 5/2009 | Ellsworth et al. | |
| 2009/0126910 A1 * | 5/2009 | Campbell | H05K 7/20781 165/104.33 |
| 2009/0154096 A1 | 6/2009 | Iyengar et al. | |
| 2009/0165868 A1 * | 7/2009 | Pearson | B60H 1/3233 137/240 |
| 2009/0259343 A1 | 10/2009 | Rasmussen et al. | |
| 2009/0262501 A1 | 10/2009 | Claassen et al. | |
| 2010/0032140 A1 | 2/2010 | Copeland et al. | |
| 2010/0032142 A1 | 2/2010 | Copeland et al. | |
| 2010/0103614 A1 | 4/2010 | Campbell et al. | |
| 2010/0103618 A1 | 4/2010 | Campbell et al. | |
| 2011/0060470 A1 | 3/2011 | Campbell et al. | |
| 2011/0075373 A1 | 3/2011 | Campbell et al. | |
| 2011/0083621 A1 | 4/2011 | Ogunleye et al. | |
| 2011/0112694 A1 | 5/2011 | Bash et al. | |
| 2011/0313576 A1 * | 12/2011 | Nicewonger | F28D 15/00 700/282 |
| 2012/0180979 A1 * | 7/2012 | Harrington | F28D 1/0246 165/11.1 |
| 2013/0098085 A1 | 4/2013 | Judge et al. | |
| 2013/0106265 A1 | 5/2013 | Shelnutt et al. | |
| 2013/0112378 A1 * | 5/2013 | Shelnutt | H05K 7/20781 165/121 |
| 2013/0128455 A1 | 5/2013 | Koblenz et al. | |
| 2013/0205822 A1 | 8/2013 | Heiland et al. | |
| 2013/0229769 A1 * | 9/2013 | Yang | G06F 1/20 361/679.53 |
| 2013/0264046 A1 | 10/2013 | Chainer et al. | |
| 2013/0312839 A1 | 11/2013 | Shelnutt et al. | |
| 2013/0312846 A1 | 11/2013 | Eriksen et al. | |
| 2013/0312854 A1 | 11/2013 | Eriksen et al. | |
| 2014/0202678 A1 | 7/2014 | Goth et al. | |
| 2014/0203550 A1 | 7/2014 | Utsch | |
| 2014/0218859 A1 | 8/2014 | Shelnutt et al. | |
| 2014/0251583 A1 | 9/2014 | Eriksen | |
| 2014/0321056 A1 | 10/2014 | Yoshikawa et al. | |
| 2014/0328562 A1 * | 11/2014 | Pitwon | G02B 6/4293 385/89 |
| 2015/0109735 A1 | 4/2015 | Campbell et al. | |
| 2015/0233597 A1 * | 8/2015 | Dempster | F24F 11/0012 165/11.2 |
| 2015/0334878 A1 * | 11/2015 | Long | H05K 7/20781 361/679.49 |
| 2016/0066480 A1 | 3/2016 | Eckberg et al. | |
| 2016/0242319 A1 | 8/2016 | Edwards et al. | |
| 2016/0242326 A1 * | 8/2016 | Edwards | H05K 7/20781 |
| 2016/0366792 A1 | 12/2016 | Smith et al. | |
| 2017/0049009 A1 | 2/2017 | Steinke et al. | |

* cited by examiner

1200

| Layer | Sensor Description | Description |
|---|---|---|
| Server | LCABLE_DETECT_N | The leak detect cable is present / connected |
| | LEAK_DETECT | Leak detect currently detecting the sensor is wet |
| | LEAK_DETECT_LATCHED | LEAK_DETECT was 1 at some point and latched |
| | SOLENOID_OPEN | Indicates the current state of the flow-control valve |
| Block | Block Leak Cable Detect | The leak detect cable is present / connected |
| | Block Leak Detect | Leak detect currently detecting the sensor is wet |
| | Block Leak Detect latched | LEAK_DETECT was 1 at some point and latched |
| | Rack Leak Cable Detect | The leak detect cable is present / connected |
| | Rack Leak Detect | Leak detect currently detecting the sensor is wet |
| | Rack Leak Detect Latched | LEAK_DETECT was 1 at some point and latched |
| | Inlet Liquid Temperature | Temperature of incoming liquid coolant into block |
| | Return Liquid Temperature | Temperature of outgoing liquid coolant from block |
| | Block Flow rate | liquid coolant flow rate incoming into block |
| Rack | RFU Leak Cable Detect | The leak detect cable is present / connected |
| | RFU Leak Detect | Leak detect currently detecting the sensor is wet |
| | RFU Leak Detect latched | LEAK_DETECT was 1 at some point and latched |
| | Supply Leak Cable Detect | The leak detect cable is present / connected |
| | Supply Leak Detect | Leak detect currently detecting the sensor is wet |
| | Supply Leak Detect Latched | LEAK_DETECT was 1 at some point and latched |
| | Return Leak Cable Detect | The leak detect cable is present / connected |
| | Return Leak Detect | Leak detect currently detecting the sensor is wet |
| | Return Leak Detect Latched | LEAK_DETECT was 1 at some point and latched |
| | Inlet Liquid Temperature | Temperature of incoming liquid coolant into rack |
| | Return Liquid Temperature | Temperature of outgoing liquid coolant from rack |
| | Filter Tray 1 Flow rate | liquid coolant flow rate outbound filter tray 1 |
| | Filter Tray 2 Flow rate | liquid coolant flow rate outbound filter tray 2 |
| Filter Differential Pressure | differential pressure across the combined filtration trays | |

| Scenario # | Local Sensors | Status | Possible Causes | Behavior | Reporting | Impact |
|---|---|---|---|---|---|---|
| 1 | RFU Leak Sensor Presence | Present | N/A | Normal Operation | Normal Operation | None |
| | RFU Leak Detection | Normal | | | | |
| | Filter Drawer 1 Flowrate | Normal | | | | |
| | Filter Drawer 2 Flowrate | Normal | | | | |
| | Filter System Differential Pressure | Low-Normal | | | | |
| | Flow Valve Position | Open | | | | |
| 2 | RFU Leak Sensor Presence | Not Present | Sensor Wire Not Connected | Do Nothing | Alert: LIMB → MC | None |
| | RFU Leak Detection | Not Present | | | | |
| | Filter Drawer 1 Flowrate | Normal | | | | |
| | Filter Drawer 2 Flowrate | Normal | | | | |
| | Filter System Differential Pressure | Low-Normal | | | | |
| | Flow Valve Position | Open | | | | |
| 3 | RFU Leak Sensor Presence | Present | Leak within RFU | Close rack supply valve, graceful shut down all sleds within rack | Alert: LIMB → MC | Whole rack loses water supply – graceful shutdown all rack servers |
| | RFU Leak Detection | Failed | | | | |
| | Filter Drawer 1 Flowrate | Normal | | | | |
| | Filter Drawer 2 Flowrate | Normal | | | | |
| | Filter System Differential Pressure | Low-Normal | | | | |
| | Flow Valve Position | Fail to close | | | | |
| 4 | RFU Leak Sensor Presence | Present | RFU Flow Valve Stuck | Gracefully shut down all sleds within rack | Alert: LIMB → MC | Graceful shutdown all rack servers |
| | RFU Leak Detection | Failed | | | | |
| | Filter Drawer | Normal | | | | |

| Scenario # | Local Sensors | Status | Possible Causes | Behavior | Reporting | Impact |
|---|---|---|---|---|---|---|
| 1 | Leak Sensor Presence | Present | N/A | Normal Operation | Normal Operation | None |
|  | Leak Detection | Normal |  |  |  |  |
|  | Flow Valve Position | Open |  |  |  |  |
| 2 | Leak Sensor Presence | Not present | Sensor wire not connected | Do nothing | Alert NPDB → BC → MC | None |
|  | Leak Detection | Not present |  |  |  |  |
|  | Flow Valve Position | Open |  |  |  |  |
| 3 | Leak Sensor Presence | Present | Water leak within sled | Sled self protect: power down and close valve | Alert NPDB → BC → MC | Single server shutdown |
|  | Leak Detection | Failed |  |  |  |  |
|  | Flow Valve Position | Open |  |  |  |  |
| 4 | Leak Sensor Presence | Present | Solenoid valve stuck | Sled power down, report to BC, block valve close | Alert NPDB → BC → MC | All block servers graceful shutdown (12) |
|  | Leak Detection | Failed |  |  |  |  |
|  | Flow Valve Position | Failed to close |  |  |  |  |

| Layer | Sensor Description | Description |
|---|---|---|
| Server | LCABLE_DETECT_N | The leak detect cable is present / connected |
| | LEAK_DETECT | Leak detect currently detecting the sensor is wet |
| | LEAK_DETECT_LATCHED | LEAK_DETECT was 1 at some point and latched |
| | SOLENOID_OPEN | Indicates the current state of the flow-control valve |
| Block | Block Leak Cable Detect | The leak detect cable is present / connected |
| | Block Leak Detect | Leak detect currently detecting the sensor is wet |
| | Block Leak Detect latched | LEAK_DETECT was 1 at some point and latched |
| | Rack Leak Cable Detect | The leak detect cable is present / connected |
| | Rack Leak Detect | Leak detect currently detecting the sensor is wet |
| | Rack Leak Detect Latched | LEAK_DETECT was 1 at some point and latched |
| | Inlet Liquid Temperature | Temperature of incoming liquid coolant into block |
| | Return Liquid Temperature | Temperature of outgoing liquid coolant from block |
| | Block Flow rate | liquid coolant flow rate incoming into block |
| Rack | RFU Leak Cable Detect | The leak detect cable is present / connected |
| | RFU Leak Detect | Leak detect currently detecting the sensor is wet |
| | RFU Leak Detect latched | LEAK_DETECT was 1 at some point and latched |
| | Supply Leak Cable Detect | The leak detect cable is present / connected |
| | Supply Leak Detect | Leak detect currently detecting the sensor is wet |
| | Supply Leak Detect Latched | LEAK_DETECT was 1 at some point and latched |
| | Return Leak Cable Detect | The leak detect cable is present / connected |
| | Return Leak Detect | Leak detect currently detecting the sensor is wet |
| | Return Leak Detect Latched | LEAK_DETECT was 1 at some point and latched |
| | Inlet Liquid Temperature | Temperature of incoming liquid coolant into rack |
| | Return Liquid Temperature | Temperature of outgoing liquid coolant from rack |
| | Filter Tray 1 Flow rate | liquid coolant flow rate outbound filter tray 1 |
| | Filter Tray 2 Flow rate | liquid coolant flow rate outbound filter tray 2 |
| | Filter Differential Pressure | differential pressure across the combined filtration trays |

*FIG. 16*

LIQUID COOLED RACK INFORMATION HANDLING SYSTEM HAVING STORAGE DRIVE CARRIER FOR LEAK CONTAINMENT AND VIBRATION MITIGATION

PRIORITY

The present invention claims priority from each of the following provisional patent applications, with relevant content of each listed provisional application incorporated herein by reference: Provisional Application Ser. No. 62/270,563, with filing date Dec. 21, 2015; and Provisional Application Ser. No. 62/270,575, with filing date Dec. 21, 2015.

BACKGROUND

1. Technical Field

The present disclosure generally relates to information handling systems (IHS), and more particular to a direct-interface liquid cooled (DL) rack-configured HIS (RIHS), having a liquid cooling subsystem and liquid-cooled nodes. Still more particularly, the disclosure is related to mitigating risk to computing components from cooling liquid leaks within the RIHS.

2. Description of the Related Art

As the value and use of information continue to increase, individuals and businesses seek additional ways to process and store information. One option available to users is Information Handling Systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

For implementations requiring a large amount of processing capability, a rack-configured (or rack) IHS (RIHS) can be provided. The RIHS includes a physical rack, within which is inserted a plurality of functional nodes, such as server (or processing) nodes/modules, storage nodes, and power supply nodes. These nodes, and particularly the server nodes, typically include processors and other functional components that dissipate heat when operating and/or when connected to a power supply. Efficient removal of the heat being generated by these components is required to maintain the operational integrity of the RIHS. Traditional heat removal systems include use of air movers, such as fans, to convectionally transfer the heat from inside of the RIHS to outside the RIHS. More recently, some RIHS have been designed to enable submersion of the server modules and/or the heat generating components in a tank of cooling liquid to effect cooling via absorption of the heat by the surrounding immersion liquid.

The amount of processing capacity and storage capacity per node and/or per rack continues to increase, providing greater heat dissipation per node and requiring more directed cooling solutions. Thus, there is a continuing need for further innovations to provide directed cooling for the individual heat generating components, both at the individual node level, as well as at the larger rack level. When designing the cooling subsystem, consideration must also be given to the different form factors of IT nodes and rack heights of the RIHS, and the ability to effectively control cooling discretely (at device or node level) and generally across the overall RIHS.

As liquid cooling improves in efficiencies and performance, data center solutions continue to focus on implementing liquid cooling at the rack level. Recently, localized liquid solutions (CPU/GPU cold plates) have been successful in removing most of the heat from these components within a server and into the facility cooling loop through direct fluid-to-fluid heat exchangers (server cooling loop to facility cooling loop) within the rack. However, when liquid is introduced into an electronic enclosure, there is potential for leaks, which can cause catastrophic system failure. Within the system enclosure, locations exist where an electronic short will create an exothermal reaction that can cause permanent damage to the system.

BRIEF SUMMARY

The illustrative embodiments of the present disclosure provides a Direct-Interface Liquid-Cooled (DL) Rack Information Handling System (RIHS), a direct-interface liquid cooling subsystem, and a method for modularly providing liquid cooling to information technology (IT) nodes within a RIHS, where the nodes are liquid cooled (LC) nodes that contain heat-generating functional components that require protection from any liquid that leaks from DL subsystem.

According to one aspect, a DL RIHS includes a rack having chassis-receiving bays. The DL RIHS includes at least one LC node having a chassis received in a respective chassis-receiving bay of the rack. The chassis contains heat-generating functional components. The LC node is configured with a system of conduits to receive direct injection of cooling liquid to regulate the ambient temperature of the node. The direct injection provides cooling to the functional components inside the node by removing heat generated by the heat-generating functional components. The chassis includes a leak containment barrier configured with a trough that underlays a portion of the system of conduits of the LC node. The trough forms a drain path to a drain port of the chassis. In one or more embodiments, the storage drive carrier comprises vibration absorbing material that mitigates vibrations of a storage drive placed in the storage drive carrier.

According to one aspect, an LC node of an RIHS includes a chassis configured to be received in chassis-receiving bay of a rack. At least one heat-generating functional component that generates heat internal to the chassis requires cooling. A system of conduits has an inlet port and an outlet port for connecting to a cooling liquid supply to receive direct intake/flow of cooling liquid. The cooling liquid regulates the ambient temperature of the LC node by absorbing and transferring heat from within the node via the cooling liquid. A leak containment barrier is configured with a trough that underlays a portion of the system of conduits of the LC node. The trough forms a drain path to a drain port of the chassis.

According to one aspect, the present disclosure provides a method of assembling a DL RIHS. In one or more embodiments, the method includes inserting a leak containment barrier in a node enclosure. The method includes provisioning the node enclosure with heat-generating functional components. The method includes attaching the system of conduits supplying cooling liquid through the node enclosure. The system of conduits includes a supply conduit extending from the node inlet coupling and a return conduit terminating in the node outlet coupling. A trough of the leak containment barrier underlays a portion of the system of conduits of the LC node and forms a drain path to a drain port of the node enclosure. The method includes mounting the LC node insertably received in the one node-receiving slot of a rack having one or more node-receiving slots. Each slot has a front opening for node insertion and a rear section opposed to the front access. For blind mating of the node inlet and outlet ports, a node-receiving liquid inlet port and a node-receiving liquid outlet port are located at the rear section of one node-receiving slot. The node-receiving liquid inlet and outlet ports are positioned to be inwardly facing to the LC node inserted in the one node-receiving slot.

According to one aspect, the present disclosure provides a method of containing leaks in a DL RIHS. In one or more embodiments, the method includes a controller communicating with a liquid sensor to detect liquid received in a leak containment barrier. The detected liquid is leaked in a trough from a received system of conduits internal to a node enclosure of a LC node that is provisioned with a heat-generating computing component. The method includes interrupting the supply flow of cooling liquid to the LC node by causing a shutoff valve to close.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which:

FIG. 12 illustrates a table data structure of a listing of receiving node (server), block and rack-level sensor signals, according to one or more embodiments;

FIG. 13 illustrates a table data structure of a listing sensor signals associated with rack-level scenarios and rack-level leak containment solutions, according to one or more embodiments;

FIG. 15 illustrates a table data structure of a listing of sensor signals with node-level scenarios and node-level leak containment solutions, according to one or more embodiments; and FIG. 16 illustrates a table data structure of a listing of sensor signals associated with sensors.

DETAILED DESCRIPTION

Figure 1:
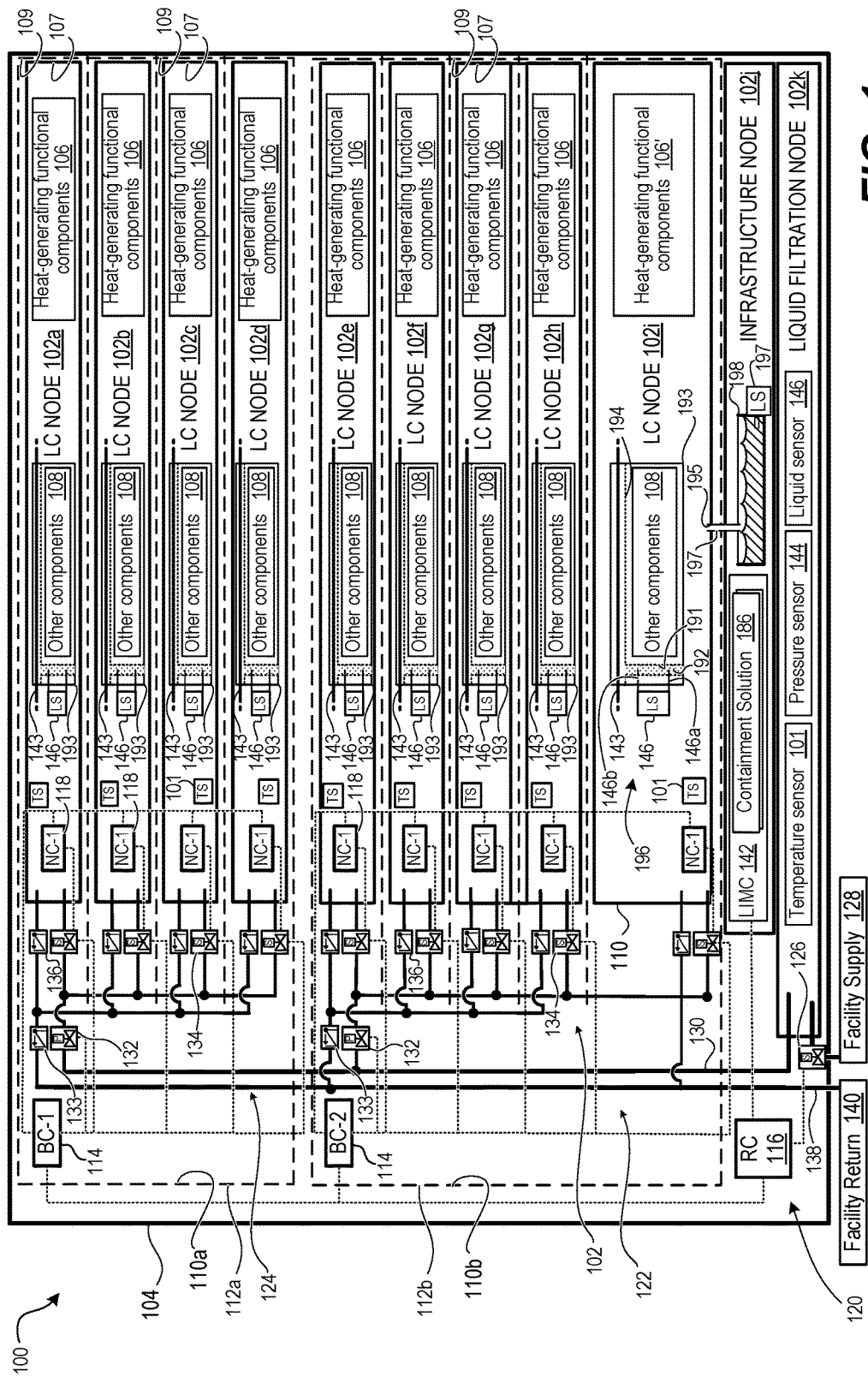
FIG. 1 illustrates a side perspective view of an internal layout/configuration of an example Direct-Interface Liquid-Cooled (DL) RIHS, according to one or more embodiments.

The present disclosure generally provides a Direct-Interface Liquid-Cooled (DL) Rack Information Handling System (RIHS) providing liquid cooled (LC) information technology (IT) nodes containing heat-generating functional components and which are cooled at least in part by a liquid cooling subsystem. The RIHS includes a rack configured with chassis-receiving bays in which is received a respective chassis of one of the LC nodes. Each LC node is configured with a system of conduits to receive direct intake/flow of cooling liquid to regulate the ambient temperature of the node. Additionally, each LC node, configured with a system of conduits, provides cooling to the components inside the node by conductively absorbing, via the cooling liquid, heat generated by the heat-generating functional components.

The absorbed heat is removed (or transferred away) from within the node to outside of the node and/or the RIHS.

The chassis has a leak containment barrier configured with a trough that underlays a portion of the system of conduits of the LC node and that forms a drain path to a drain port of the chassis. Based on portions of the RIHS that can be exposed to the leak, a Liquid Infrastructure Management Controller (LINC) implements a leak detection solution to avoid or mitigate damage to computing components.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

As utilized herein, the term "rack-configured" (as in RIHS) generally refers to the configuration of a large scale sever system within a physical rack having multiple chassis receiving rails for receiving specific sizes of information technology (IT) nodes, such as server modules, storage modules, and power modules. The term node generally refers to each separate unit inserted into a 1 U or other height rack space within the rack. In one embodiment, operational characteristics of the various IT nodes can be collectively controlled by a single rack-level controller. However, in the illustrated embodiments, multiple nodes can be arranged into blocks, with each block having a separate block-level controller that is communicatively connected to the rack-level controller.

For purposes of this disclosure, an information handling system (defined at the individual server level) may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components.

As illustrated by the figures and described herein, multiple processing servers or server IHSs (referred to herein as server nodes) can be included within the single RIHS. Certain aspect of the disclosure then relate to the specific LC (sever or other) nodes and the functionality associated with these individual nodes or block-level groupings of nodes, while other aspects more generally relate to the overall DL RIHS containing all of the LC nodes.

As one design detail/aspect for the present innovation, consideration is given to the fact that extreme variations can exist in server/power/network topology configurations within an IT rack. In addition to dimension variations, the thermal requirements for heat-generating functional components for power, control, storage and server nodes can be very different between types or vary according to usage. These variations drive corresponding extreme diversity in port placement, fitting size requirements, mounting locations, and manifold capacity for a liquid cooling subsystem. Further, a chassis of each node is typically densely provisioned. Lack of space thus exists to mount a discrete water distribution manifold in high-power IT racks. The present disclosure addresses and overcomes the challenges with distributing liquid cooling fluids throughout an IT rack having nodes with a large number of variations in distribution components.

The disclosure also includes the additional consideration that in addition to cooling the primary heat generating components of the rack, such as the processor, what is needed is a way to allow for cooling of secondary equipment within the rack, as well as auxiliary components that would further support utilizing the advantages of a fluid-to-fluid heat exchanger methodology. Additionally, the present disclosure provides a modular approach to utilizing an air-to-liquid heat exchanger with quick connection and scalability to allow the solution to be scalable in both 1 U and 2 U increments.

FIG. 1 illustrates a side perspective view of an internal layout/configuration of an example Direct-Interface Liquid-Cooled (DL) RIHS 100 configured with a plurality of LC nodes 102, according to one or more embodiments. For simplicity, the example DL RIHS presented in the various illustrations can be described herein as simply RIHS 100;

however, references to RIHS 100 are understood to refer to a DL RIHS, with the associated liquid cooling infrastructure and/or subsystems and supported LC nodes 102. RIHS 100 includes rack 104, which comprises a rack frame and side panels, creating a front-to-back cabinet within which a plurality of chassis receiving bays are vertically arranged and in which a chassis of a respective IT node 102 can be inserted. Rack 104 includes certain physical support structures (not specifically shown) that support IT gear insertion at each node location. Additional description of the structural make-up of an example rack is provided in the description of FIGS. 2-4, which follows.

FIG. 1 depicts an illustrative example of LC nodes 102a-102j (collectively refer to as nodes 102), with each nodes 102a-102i including heat-generating functional components 106. Additionally, RIHS 100 also includes an infrastructure node 102j and liquid filtration node 102k, which do not necessarily include heat-generating functional components 106 that require liquid cooling, as the other LC nodes 102a-102i. In the illustrative embodiments, nodes 102a-102b, and 102e-102h include other components 108 that are not necessarily heat generating, but which are exposed to the same ambient heat conditions as the heat generating components by virtue of their location within the node. In one embodiment, these other components 108 can be sufficiently cooled by the direct-interface liquid cooling applied to the node and/or using forced or convective air movement, as described later herein. Each node 102 is supported and protected by a respective node enclosure 107. Nodes 102a-102d are further received in node receiving bays 109 of a first block chassis 110a of a first block 112a. Nodes 102e-102i are received in a second block chassis 110 of a second block 112b. In the illustrative embodiments, the nodes 102 are vertically arranged. In one or more alternate embodiments, at least portions of the nodes 102 (and potentially all of the nodes) may also be arranged horizontally while benefiting from aspects of the present innovation.

The present innovation is not limited to any specific number or configuration of nodes 102 or blocks 112 in a rack 104. According to one aspect, nodes 102 can be of different physical heights of form factors (e.g., 1 U, 1.5 U, 2 U), and the described features can also be applied to nodes 102 having different widths and depths (into the rack), with some extensions made and/or lateral modifications to the placement of cooling subsystem conduits, as needed to accommodate the different physical dimensions. As a specific example, node 102i is depicted as having a larger node enclosure 107' (with corresponding different dimensions of heat-generating functional components 106') of a different number of rack units in physical height (e.g., 2 U) that differs from the heights (e.g., 1 U) of the other nodes 102a-102h and 102j-102k. RIHS 100 can include blocks 112 or nodes 102 selectably of a range of discrete rack units. Also, different types of IT components can be provided within each node 102, with each node possibly performing different functions within RIHS 100. Thus, for example, a given node 102 may include one of a server module, a power module, a control module, or a storage module. In a simplest configuration, the nodes 102 can be individual nodes operating independent of each other, with the RIHS 100 including at least one rack-level controller (RC) 116 for controlling operational conditions within the RIHS 100, such as temperature, power consumption, communication, and the like. Each node 102 is then equipped with a node-level controller (NC) 118 that communicates with the rack-level controller 116 to provide localized control of the operational conditions of the node 102. In the more standard configuration of a DL RIHS 100, and in line with the described embodiments, RIHS 100 also includes block-level controllers (BCs) 114, communicatively coupled to the rack-level controller 116 and performing block-level control functions for the LC nodes within the specific block. In this configuration, the nodes 102 are arranged into blocks 112, with each block 112 having one or more nodes 102 and a corresponding block-level controller 114. Note the blocks do not necessarily include the same number of nodes, and a block can include a single node, in some implementations.

A Direct-Interface Liquid Cooling (DL) subsystem (generally shown as being within the RIHS and labelled herein as 120) provides direct-intake/flow of cooling liquid to heat-generating functional components 106 via a liquid rail 124 under the control of rack-level controller 116, block-level controllers 114, and/or node-level controllers 118, in some embodiments. Rack-level controller 116 controls a supply valve 126, such as a solenoid valve, to allow cooling liquid, such as water, to be received from a facility supply 128. The cooling liquid is received from facility supply 128 and is passed through liquid filtration node 102l before being passed through supply conduit 130 of liquid rail 124. Each block 112a, 112b receives a dynamically controlled amount of the cooling liquid via block-level dynamic control valve 132, such as a proportional valve. Return flow from each block 112a, 112b can be protected from backflow by a block check valve 133. The individual needs of the respective nodes 102a-102d of block 112a can be dynamically provided by respective node-level dynamic control valves 134, controlled by the block-level controller 114, which control can, in some embodiments, be facilitated by the node-level controllers 118. In one or more embodiments, at node level the control valves 134 can be shutoff valves for emergency shutoff for leaks rather than dynamically controlled for thermal optimization. In addition to allocating cooling liquid in accordance with cooling requirements (which can be optimized for considerations such as performance and economy), each of the supply valve 126 and/or dynamic control valves 132, 134 can be individually closed to mitigate a leak. A check valve 136 is provided between each node 102a-102j and a return conduit 138 of the liquid rail 124 to prevent a backflow into the nodes 102a-102j. The return conduit 138 returns the cooling liquid to a facility return 140.

To support the temperature control aspects of the overall system, RIHS 100 includes temperature sensors 101 that are each located within or proximate to each node 102a-102j, with each temperature sensor 101 connected to the node-level controller 118 and/or the corresponding block-level controller 114. Temperature sensors 101 operate in a feedback control loop of the liquid cooling system 122 to control the amount of liquid flow required to cool the nodes 102a-102j. In one or more embodiments, the rack-level controller 116 can coordinate performance constraints to block-level controllers 114 and/or node-level controllers 118 that limit an amount of heat generated by the heat-generating functional components 106 to match a heat capacity of the flow of cooling liquid in DL subsystem 122. Alternatively or in addition, the rack-level controller 116 can coordinate cooling levels to block-level controllers 114 and/or node-level controllers 118 that in turn control the dynamic control valves 132, 134 for absorption and transfer of the heat generated by the heat-generating functional components 106 by the DL subsystem 122. In one or more embodiments, support controllers such as a Liquid Infrastructure Management Controller (LIMC) 142 can perform management and operational testing of DL subsystem 122. LIMC 142 can monitor pressure sensors 144 and liquid sensors 146 to detect a leak, to validate operation of a dynamic control valves 132, 134 or shut-off valves such as supply valve 126. LIMC 142 can perform closed-loop control of specific flow rates within the RIHS 100.

DL nodes 102a-102j can include other components 108 such as a hard drive device (HDD) that does not require DL cooling but could be damaged by moisture from the DL subsystem 122. A leak containment barrier 193 is configured with a trough 194 that underlays a portion of the system of conduits 143 of the LC node 102a-102j. The trough 194 forms a drain path 191 to a drain port 195 of the chassis 110. A leak control subsystem 196 includes a cascading gutter structure of drain conduits 197 originating from each trough 194 of a respective LC node 102a-102j of the RIHS 100. An absorbent material 192 can be positioned to absorb and hold at least an initial portion of any liquid that leaks in the leak containment barrier 193. The trough 194 can direct even a small, slow leak to accumulate in a low portion for detection purposes. In one or more embodiments, the node-level liquid sensor 146 is exposed to the absorbent material 192 to detect a presence of liquid within the absorbent material 192. For example, a pair of electrical conduits 146a, 146b can be inserted within the absorbent material and separated by a volume of the absorbent material 192. An electrical current passes from a first conduit 146a to a second conduit 146b only when the absorbent material has absorbed a minimum threshold supply of leaked fluid.

The drain conduits 197 converge into a collection structure 198 that receives leaked liquid that flows through the cascading gutter structure. LIMC 142 is in communication with the at least one liquid sensor 146 that triggers a closing of one or more shutoff valve 132, 134 in response to a corresponding liquid sensor 146 detecting a liquid leak in the RIHS 100. In one or more embodiments, LIMC 142 is in communication with the node-level, block-level, and rack-level liquid sensors 146. LIMC 142 associates a leak with a containment solution 186. LIMC 142 triggers closure of one or more shutoff valves 126, 132, and 134 to effect the containment solution 186 in response to the detected presence of liquid in the collection structure.

Figure 2:
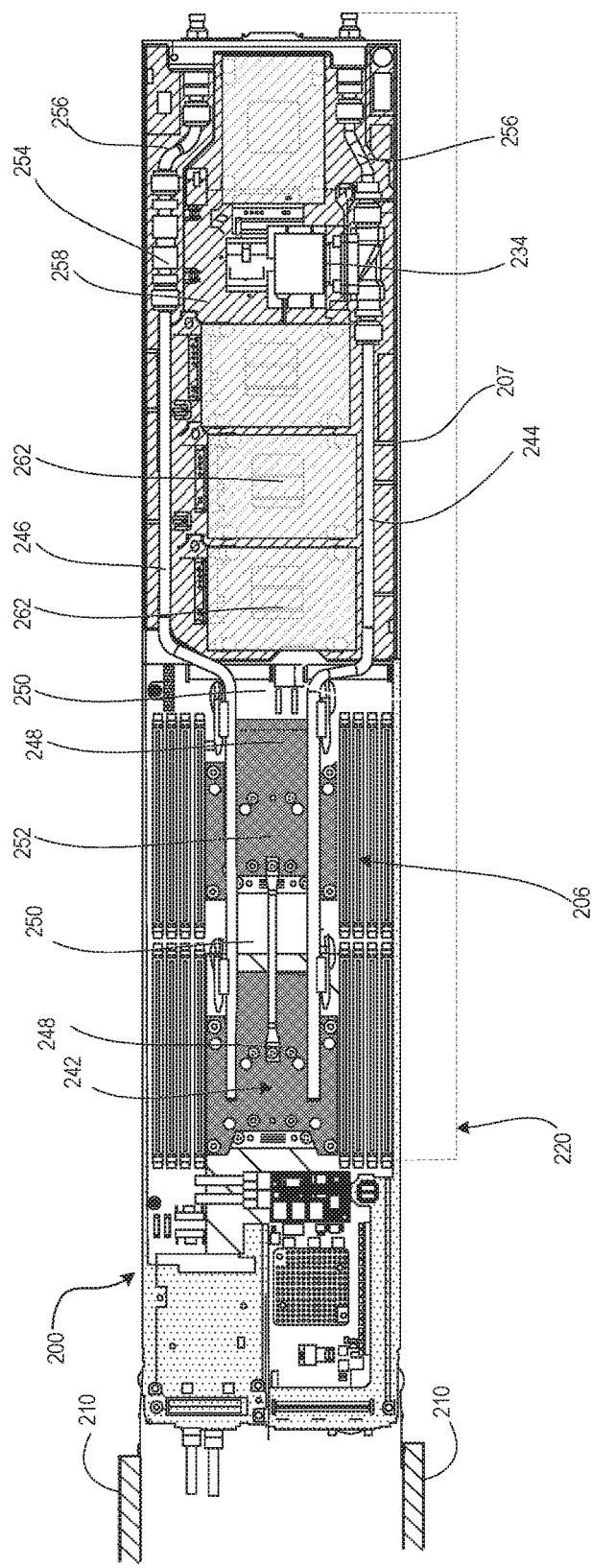
FIG. 2 illustrates a top view of an example LC node configured with a liquid cooling subsystem that includes a liquid-to-liquid manifold and cooling pipes for conductively cooling internal functional components, according to one or more embodiments.
Figure 3:
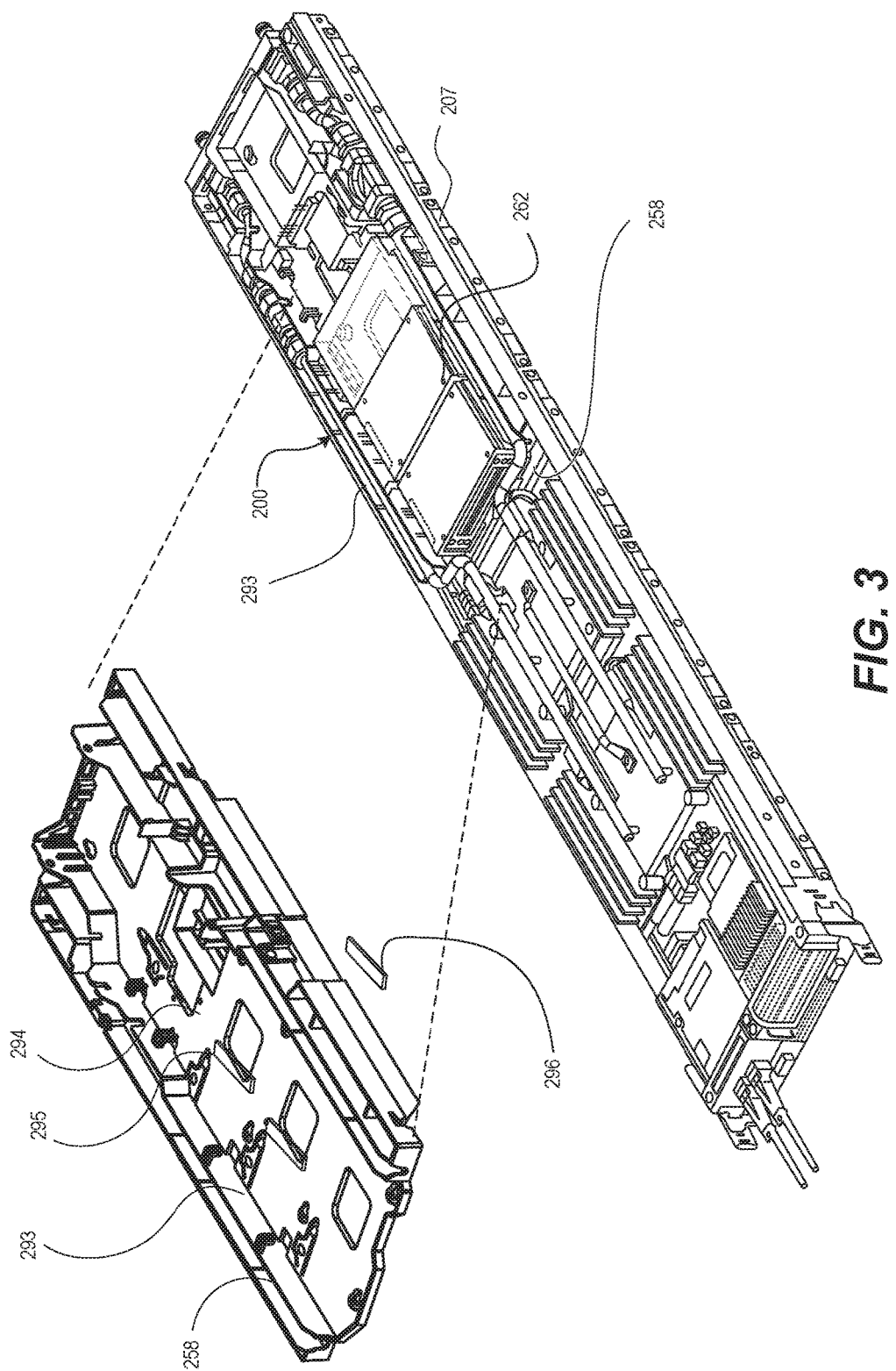
FIG. 3 illustrates a front perspective view of the example LC node of FIG. 2 with a detailed view of a leak containment barrier, according to one or more embodiments.

FIGS. 2-3 illustrate example LC node 200 of example DL RIHS 100 of FIG. 1 having a node enclosure 207 insertable into a block chassis 210. For purposes of description, node 200 is a server IHS that includes processing components or central processing units (CPUs), storage devices, and other components. LC node 200 includes cooling subsystem (generally shown and represented as 220) that includes a liquid-to-liquid manifold 242 to cool heat-generating functional components 206 by heat transfer from liquid provided by node-level supply conduit 244, and return conduit 246, according to one or more embodiments. Node-level supply conduit 244 and return conduit 246 are appropriately sized and architecturally placed relative to the other components and the dimensionality (i.e., width, height, and depth/length) of LC node 200 to permit sufficient cooling liquid to pass through the interior of LC the node 200 to remove the required amount of heat from LC node 200 in order to provide appropriate operating conditions (in terms of temperature) for the functional components located within LC node 200. Liquid-to-liquid manifold 242 can include CPU cold plates 248 and voltage regulator cold plates 250. A sled assembly grab handle 252 can be attached between CPU cold plates 248 for lifting LC node 200 out of block chassis 210. A return-side check valve 254 of the return conduit 246 can prevent facility water from back-feeding into LC node 200 such as during a leak event. Flex hose links 256 in each of node-level supply conduit 244 and return conduits 246 can reduce insertion force for sleds into block chassis 210. Sled emergency shutoff device 234 interposed in the supply conduit 244 can be a solenoid valve that closes in response to input from a hardware circuit during a sled-level leak detection event. With particular reference to FIG. 3, node-level carrier 258 received in node enclosure 207 can incorporate the leak containment barrier 293 to protect storage device 262. In the illustrative example illustrated by FIG. 2, LC node 200 is oriented horizontally and is viewed from above. In one or more embodiments node-level carrier 258 is configured to route leaked cooling liquid away from storage device 262 when oriented vertically.

According to one aspect, support surface 294 of node-level carrier 258 incorporates a vibration absorbing material that can be integral to structural portions of the node-level carrier 258. In one or more embodiments, top vibration absorbing component 295, such as a double-sided, adhesive backed, foam strip, can provide an attachment of storage devices 262 to the node-level carrier 258. In one or more embodiments, bottom vibration absorbing component 296, such as a double-sided, adhesive backed, foam strip, can provide an attachment of node-level carrier 258 to node enclosure 207. The vibration absorbing material isolates sources of vibration to prevent the vibration from constructively amplifying to the point of impairing performance or damaging IT equipment. For example, a storage drive 262 can include a disk drive that creates a vibration during a repeated sequence of sector reads or writes. As another example, the liquid cooling system can include vibrations originating from movement/flow of the fluid moving and/or flow volume control. As yet an additional example, air movers can create vibrations. With these vibration absorbing materials integrated into the design, node-level carrier 258 protects the storage devices 262 from vibrations originating at or otherwise delivered to storage devices 262.

Figure 5:
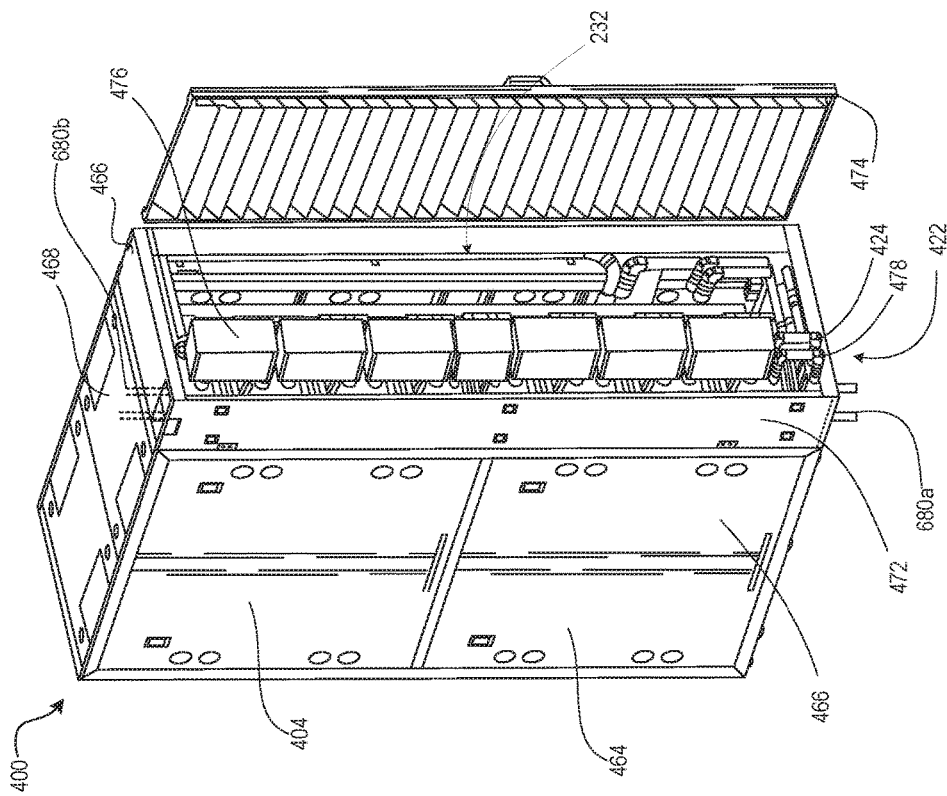
FIG. 5 illustrates a rear perspective view of an example DL RIHS with a louvered rear door in an open position, according to one or more embodiments.
Figure 4:
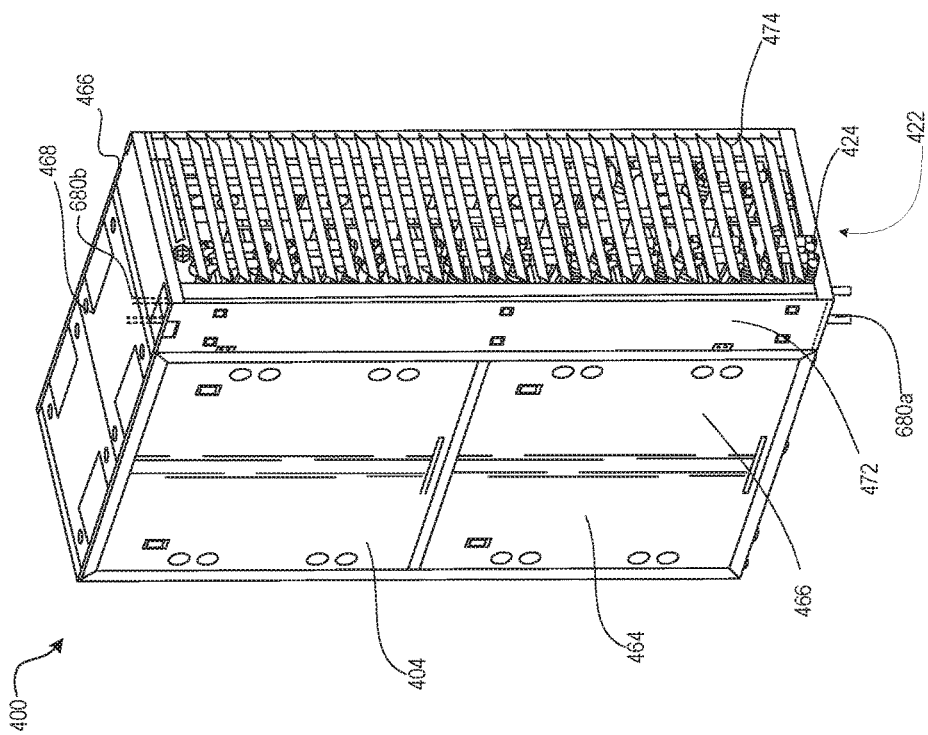
FIG. 4 illustrates a rear perspective view of an example DL RIHS with a louvered rear door in a closed position over uncovered MLD conduits, according to one or more embodiments.
Figure 6:
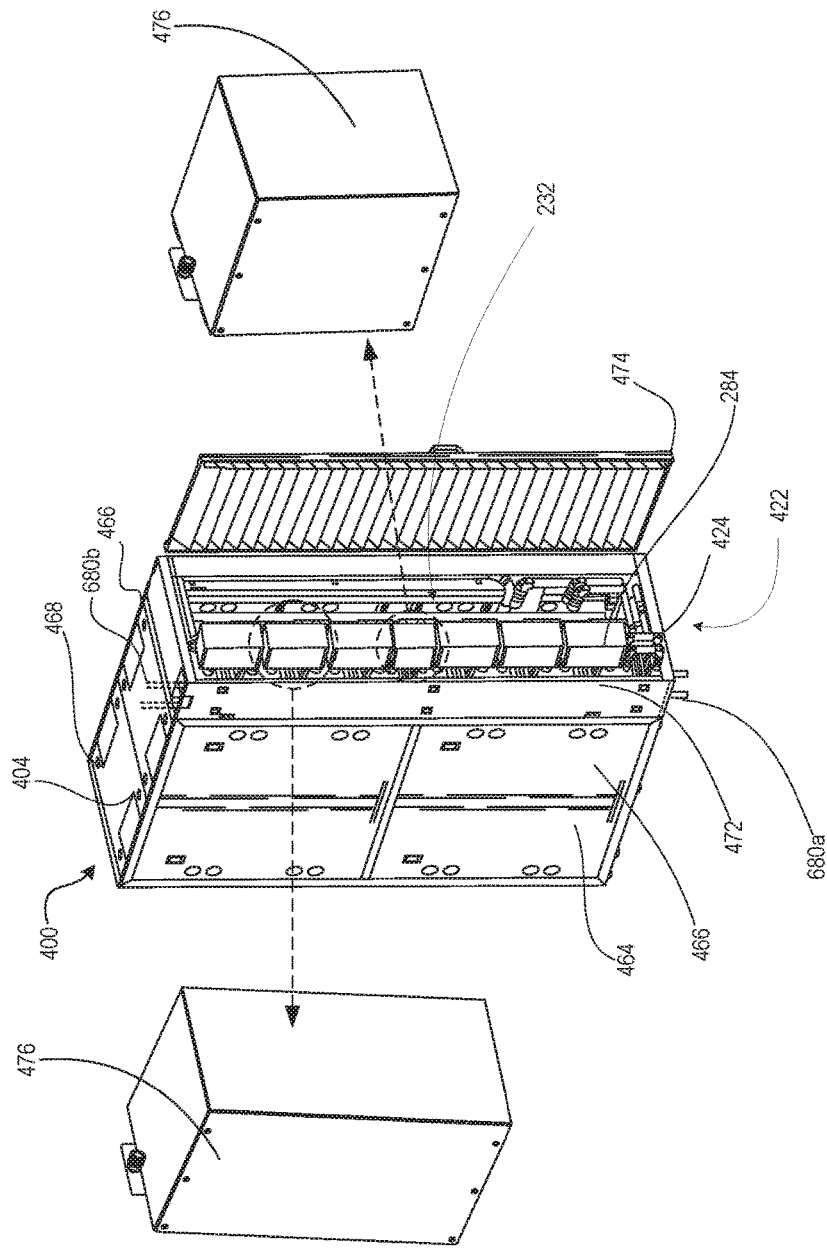
FIG. 6 illustrates the rear perspective view of FIGS. 4-5 with the pipe covers removed to expose modular liquid distribution (MLD) conduits, according to one or more embodiments.

FIGS. 4-6 illustrate different exterior and rear views of an example assembled DL RIHS 400. DL RIHS 400 includes rack 404, which is a physical support structure having an exterior frame and attached side panels to create cabinet enclosure 464 providing interior chassis receiving bays (not shown) within which a plurality of individual node chasses (or sleds) 207 of functional IT nodes, such as LC node 200 of FIG. 2, are received. In the description of the figures, similar features introduced in an earlier figure are not necessarily described again in the description of the later figures. In an exemplary embodiment, the cooling liquid is received from a facility supply 128 (of FIG. 1) via below rack (e.g. ground level or below floor) connections 680a. In one or more embodiments, the cooling liquid is received via an above-rack (and possibly in ceiling) connections 680b.

FIGS. 4-6 specifically illustrate exterior views of rack 404 of example DL RIHS 100. As illustrated, rack 404 includes opposing side panels 466, attached to a top panel 468 (and bottom panel—not shown) to create the main cabinet enclosure 464 that includes multiple chassis receiving bays for housing LC nodes 102/200. The created cabinet enclosure 464 includes a front access side (not shown) and a rear side. The front access side provides access to the chassis receiving bays created within the main cabinet enclosure 464 for receiving LC nodes 102 (of FIG. 1) into rack 404. Attached to the rear ends of the main opposing side panels 466 are opposing side panel extensions 472. A louvered rear door 474 is hinged (or otherwise attached) to one of the side panel extensions 472 and includes a latching mechanism for holding the door 474 in a closed position, where in a closed position is relative to the otherwise open space extending laterally between opposing side panel extensions 472. Side panel extensions 472 and louvered rear door 474 provide an extension to main cabinet enclosure 464 for housing, covering/protecting, and providing access to the modular, scalable liquid rail 424 of a liquid cooling subsystem 422 that provides liquid cooling to each LC node 102 (of FIG. 1) inserted into the chassis of the main cabinet enclosure 464.

FIGS. 5-6 illustrate an embodiment in which rear pipe covers 476 can protect portions of liquid rail 324, and specifically Modular Liquid Distribution (MLD) conduits 478, from inadvertent damage as well as containing any leaks from being directed at sensitive functional components 106 (of FIG. 1). FIG. 5 illustrate that the rear pipe covers 476 can be vertically sized to correspond to MLD conduits 478.

Figure 7:
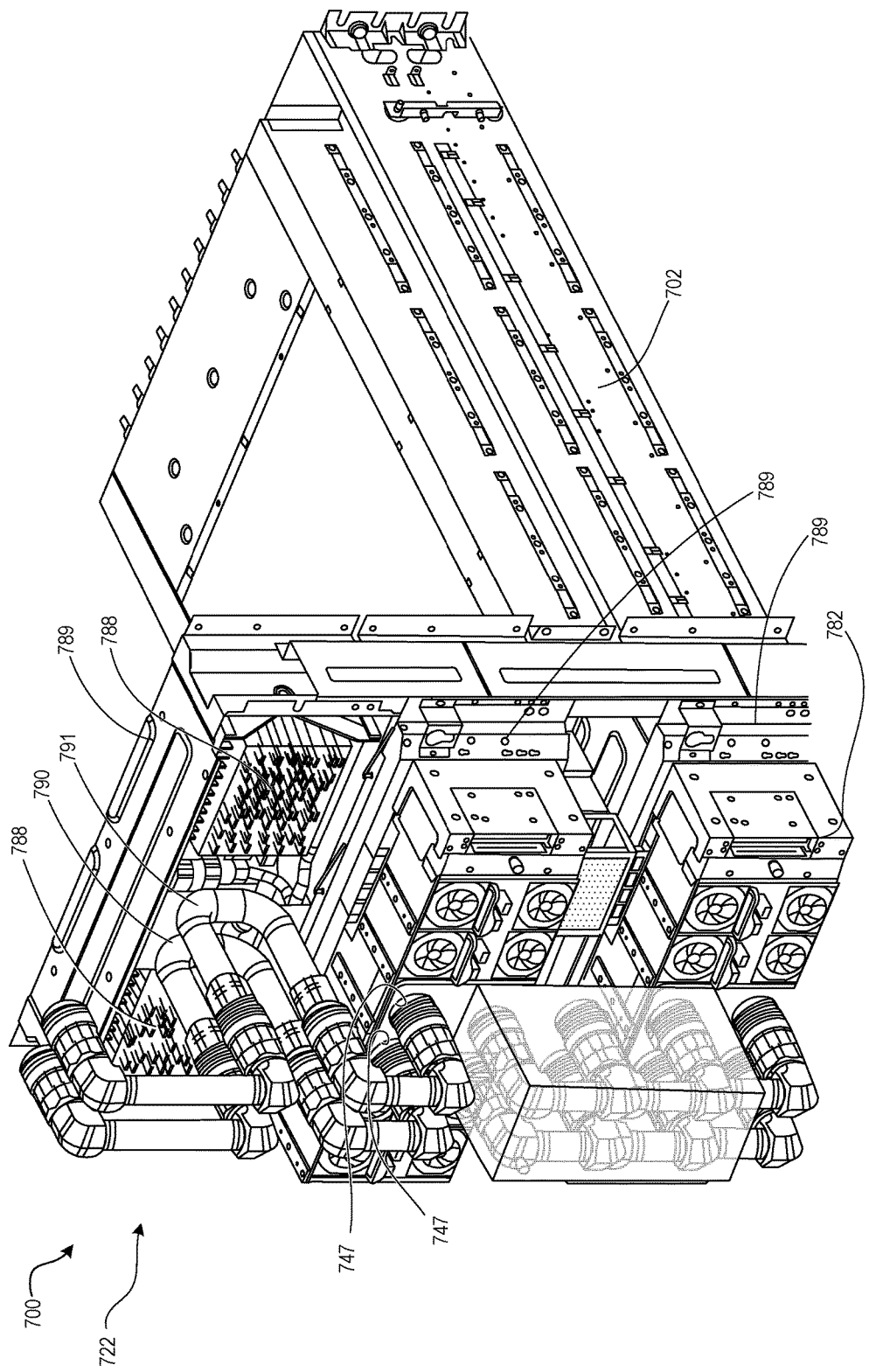
FIG. 7 illustrates a perspective view of a portion of a DL RIHS depicting example nodes, block radiators with Air-Liquid heat exchangers, and MLD conduits, according to one or more embodiments.

FIG. 7 illustrates a more detailed view of the internal makeup of the rails and other functional components of a cooling subsystem 722 of example RIHS 700. According to one embodiment, cooling subsystem 722 also includes air movers and/or other devices to provide for forced air cooling in addition to the direct interface liquid cooling. As shown by FIG. 7, at least one fan module 782 is rear mounted to a block liquid manifold 789 in which an air-to-liquid heat exchanger (or radiator) 788 is incorporated. The fan module 782 provides air movement through the chassis 710 and/or node enclosure 708 of the node 702 as well as through the air-to-liquid heat exchanger 788. Each block liquid manifold 789 includes a supply bypass tube 790 and a return bypass tube 791 through which a dynamically determined amount of cooling liquid is directed into the respective node 702 while allowing a bypass flow to proceed to the next node/s 702 in fluid path of the intake flow. Fan module 782 includes apertures 747 through which the supply and return bypass tubes 790, 791 are extended, in one embodiment. Nodes 702 are connected into the back side of the block liquid manifold with the ends of intake and exhaust liquid transfer conduits in sealed fluid connection with bypass tubes 790 and 791 respectively.

Figure 8:
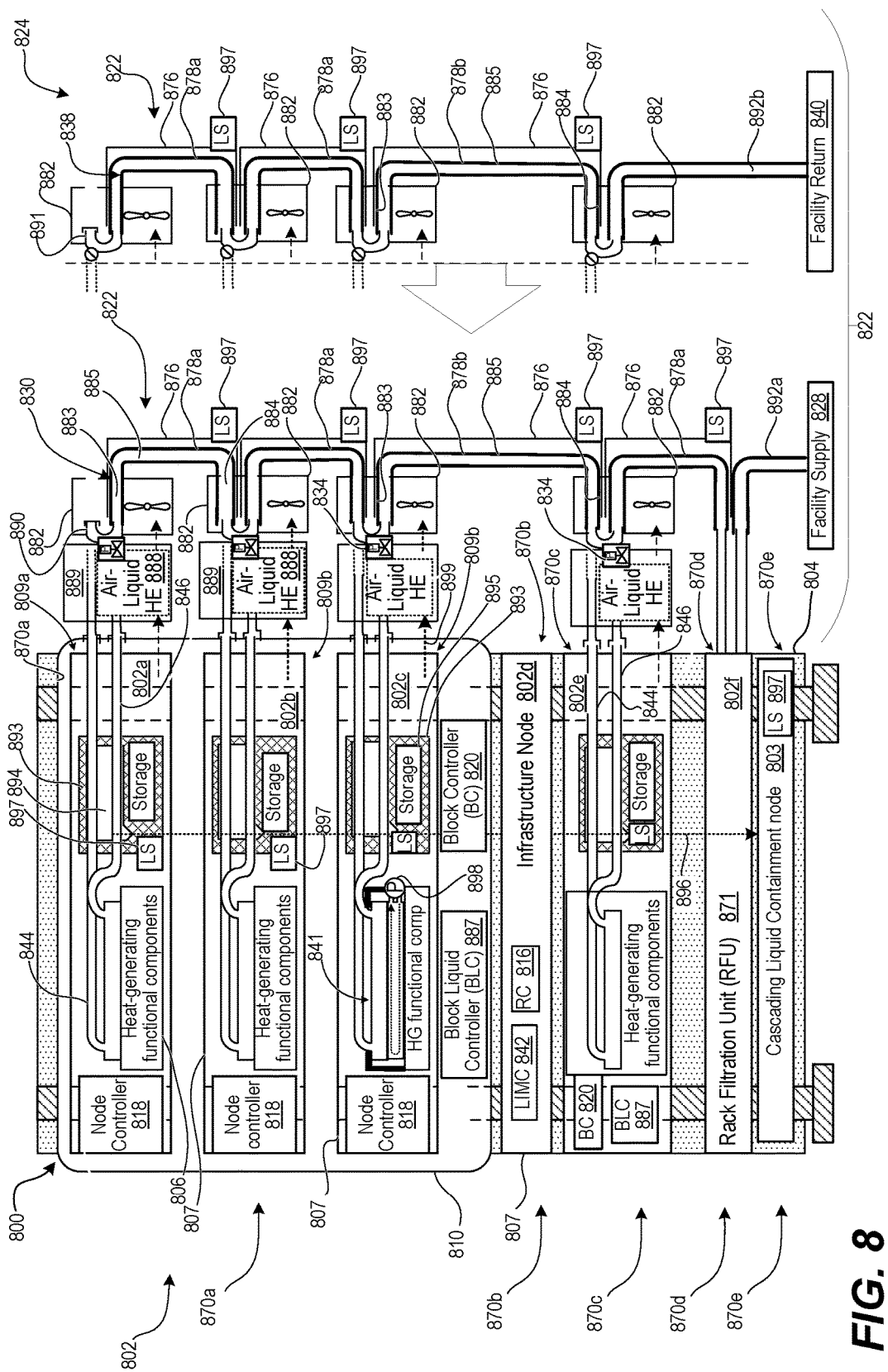
FIG. 8 illustrates a detailed block diagram of a DL RIHS configured with LC nodes arranged in blocks and which are cooled in part by a liquid cooling system having a rail comprised of MLD conduits, and in part by a subsystem of air-liquid heat exchangers, according to multiple embodiments.

FIG. 8 illustrates a more detailed view of the interconnections of the liquid cooling subsystem, at a node level and rack level within an example DL RIHS 800. As shown, RIHS 800 is configured with LC nodes 802a-802e arranged in blocks (e.g., block 1 comprising 802a-802c) and which are cooled in part by a liquid cooling system having a liquid rail comprised of MLD conduits, and in part by a subsystem of air-liquid heat exchangers, can be configured with heat-generating functional components 806 and that are cooled at least in part by a system of MLD conduits 878a-878b, according to one or more embodiments. Illustrated within nodes 802 are heat-generating functional components 806, such as processors, voltage regulators, etc., which emit heat during operation and or when power is applied to the component, such that the ambient temperature increases around the component, and within the node, and eventually within the block, and ultimately DL RIHS 800, during standard operation. To mitigate heat dissipation (and effects thereof), and to maintain the RIHS, block, node, and functional components within proper operating temperatures, DL RIHS 800 is configured with a DL subsystem 822. DL subsystem 822 includes a rack level network of liquid propagating pipes, or conduits that are in fluid communication with individual node level networks of liquid propagating conduits. Additionally, DL subsystem 822 collectively facilitates heat absorption and removal at the component level, the node level, the block level, and/or the rack level. The rack-level network of conduits includes a modular arrangement of a liquid rail 824 formed by more than one node-to-node MLD conduit 878a-878b spanning (or extending) between LC nodes 802 provisioned in rack 804.

At the top position of RIHS 800, a block chassis 810 is received in a block chassis receiving bay 870a of rack 804. Within block chassis 810, a first node 802a received in a first node receiving bay 809a of the rack 804 has a vertical height of one rack unit (1 U). A rack unit, U or RU as a unit of measure, describes the height of electronic equipment designed to mount in a 19-inch rack or a 13-inch rack. The 19 inches (482.60 mm) or 13 inches (584.20 mm) dimension reflects the horizontal lateral width of the equipment mounting-frame in the rack including the frame; the width of the equipment that can be mounted inside the rack is less. According to current convention, one rack unit is 1.75 inches (44.45 mm) high. A second node 802b received in a second node receiving bay 809b of the rack 104 (of FIG. 1) has a vertical height of 1 U. A third node 802c received in a third node receiving bay 809c of the rack 804 has a vertical height of 1 U. A fourth node 802d, infrastructure node 802b, is received in a second block chassis receiving bay 870b of rack 804 and has a vertical height of 1 U. Infrastructure node 802b can contain functional components such as a rack-level controller 816. A fifth node 802e is received in a third chassis receiving bay 870c and has a vertical height of 2 U. A sixth node 802f, which provides a Rack Filtration Unit (RFU) 871, is received in a fourth block chassis receiving bay 870d of the rack 804. Infrastructure node 802 and RFU 871 are examples of nodes 802 that may not require liquid cooling. A cascading liquid containment structure 803 is received in a fifth chassis receiving bay 870e and includes liquid sensor 897.

MLD conduits 878a of 1 U can be used to connect nodes of 1 U vertical spacing. Because of the additional 1 U separation of LC nodes 802c and 802e by inclusion of infrastructure node 802d, MLD conduit 878b between the third and fifth nodes 802c-802d is dimension 2 U to accommodate the increased spacing. MLD conduits 878a-878b can thus support different heights (1 U to NU) of IT components.

Each MLD conduit 878a-878b includes first and second terminal connections 883, 884 attached on opposite ends of central conduit 885 that is rack-unit dimensioned to seal to a port of LC node 802 and enable fluid transfer between a port of a selected LC node 802 and a port of an adjacent LC node 802. In FIG. 8, facility supply 828 and facility return 840 are respectively located at the intake end of liquid rail 824 and the exhaust end of liquid rail 824. The actual location of facility supply 828 and facility return 840 can be reversed. Alternatively, facility supply 828 and facility return 840 can be located above the RIHS 800 or both conduits can be located on opposite sides of the RIHS 800 in alternate embodiments.

Liquid cooling subsystem 822 includes a liquid infrastructure manager controller (LIMC) 842 which is communicatively coupled to block liquid controllers (BLCs) 887 to collectively control the amount of cooling liquid that flows through the RIHS 800 and ultimately through each of the nodes 802 in order to effect a desired amount of liquid cooling at the component level, node level, block level, and rack level. For clarity, LIMC 842 and BLCs 887 are depicted as separate components. In one or more embodiments, the liquid control features of the LIMC 842 and BLCs 887 can be incorporated into one or more of the rack-level controller 816, block-level controllers 820, and the node-level controllers 818. As illustrated in FIG. 1 and previously described, each of the LIMC 842 and BLCs 887 are connected to and respectively control the opening and closing of flow control valves that determine the amount of flow rate applied to each block and to each node within the specific block. During cooling operations, one of LIMC 842 and BLC 887 causes a specific amount of liquid to be directly injected into the intake conduits of the LC node 802, which forces the cooling liquid through the system of conduits within the LC node 802 to the relevant areas and/or functional components/devices inside the nodes 802 to absorb and remove heat away from the inside of the node and/or from around the components within the node.

As another aspect, the present disclosure provides a modular approach to utilizing air-to-liquid heat exchanger 888 with quick connection and is scalable in both 1 U and 2 U increments. In one or more embodiments, DL cooling subsystem 822 can include a plurality of air-to-liquid (or liquid-to-air) heat exchangers 888 that facilitate the release of some of the heat absorbed by the exhaust liquid to the surrounding atmosphere around the RIHS 100 (of FIG. 1). Air-to-liquid heat exchangers 888 can be integral to block liquid manifold 889 that, along with the MLD conduits 878a-878b, form scalable liquid rail 824. One aspect of the present disclosure is directed to providing scalable rack-mounted air-to-liquid heat exchanger 888 for targeted heat rejection of rack-mounted equipment to DL cooling subsystem 822. Hot air 899 from auxiliary components, such as storage device 808, would be pushed through the air-to-liquid heat exchanger 888, and the resulting energy would transfer to liquid rail 824 and be rejected to a facility cooling loop, represented by the facility return 840.

RIHS 800 can include variations in LC node 802 that still maintain uniformity in interconnections along liquid rail 824 formed by a chassis-to-chassis modular interconnect system of MLD conduits 878a-878b. With this scalability feature accomplished using MLD conduits 878a-878b, cooling subsystem 822 of the RIHS 800 allows each block chassis 810 to be a section of a scalable manifold, referred herein as liquid rail 824, eliminating the need for a rack manifold. The scalability of liquid rail 824 enables flexible configurations to include various permutations of server and switch gear within the same rack (rack 804). MLD conduits 878a-878b can comprise standardized hoses with sealable (water tight) end connectors. Thus, the rack liquid flow network can encompass 1 to N IT chassis without impacting rack topology, space constraints, and without requiring unique rack manifolds. Additionally, according to one aspect, the MLD conduits are arranged in a pseudo daisy chain modular configuration, which allows for unplugging of one MLD conduit from one rack level without affecting liquid flow to and cooling of other rack levels.

The system of conduits extending from node intake valve 834 into each LC node 802 enables each LC node 802 to engage to block liquid manifold 889. Block chassis 810 or node enclosure 807 of each LC node 102 provides the intake and exhaust conduit connections to engage to respective terminals of MLD conduits 878a-878b within the MLD network provided by liquid rail 824. For example, where nodes 802 are designed as sleds, node enclosure 807 would be a sled tray, and each block would then include more than one sled tray received into block chassis 810, forming the extensions of block liquid manifold 889. Alternatively, the node enclosure 807 can be a single node chassis such as one of nodes 802c-802f.

Supply and return bypass tubes 890, 891 of each block liquid manifold 889 are connected by MLD conduits 878a-878b to form supply rail conduit 830 and return rail conduit 838. For clarity, FIG. 8 illustrates the return rail conduit 838 separately. Liquid rail 824 enables multiple types of devices to be coupled together, each receiving an appropriately controlled portion of cooling liquid capacity. In one embodiment, liquid cooling subsystem 822 is passively pressurized by attaching MLD supply conduit 892a to facility supply 828 and an MLD return conduit 892b to facility return 840. Liquid flow from supply rail conduit 830 to return rail conduit 838 of liquid rail 824 can be controlled based upon factors such as a temperature of the liquid coolant, detected temperature within LC nodes 802, air temperature inside or outside of DL RIHS 800, etc.

In an exemplary embodiment, the scalable rack manifold provided by liquid rail 824 is formed in part by MLD conduits 878a-878b that run vertically in the back of the RIHS 800 with quick disconnects on the front and rear face of block liquid manifold 889 that allows for IT/infrastructure equipment respectively to be plugged into both front and back sides of the block liquid manifold 889. For example, LC nodes 802, such as server modules, can plug into the front side and fan modules 882 can plug onto the back side of block liquid manifold 889. This also allows for other liquid cooled devices such as LC Power Distribution Units (PDUs) to be plugged into the cooling liquid supply rail conduit 830 and return rail conduit 838 of liquid rail 824. Thereby, a rack hot pluggable cooling interface is created for any rack-mounted equipment.

Cooling subsystem 822 can support an embedded liquid-to-liquid heat exchanger manifold 841, such as in LC node 802c. Node liquid-to-liquid heat exchangers are provided for rejecting heat from one fluid source to a secondary source. One aspect of the present disclosure solves the problems that many shared-infrastructure IT systems (e.g., blade chassis) do not have adequate space to accommodate a liquid-to-liquid heat exchanger. Unlike with generally-known systems that rely upon liquid heat transfer having to exchange heat with an external liquid-to-liquid heat exchanger, the present disclosure enables on-rack liquid-to-liquid heat exchanger that does not require any of the vertical chassis space. Additionally, the present disclosure provides these benefits without requiring a central distribution unit (CDU), which takes up datacenter floor space. One aspect of the present disclosure provides embedded heat exchanger manifold 841 having a common heat transfer plate and a shared bulk header to create a combined liquid distribution manifold that includes a secondary liquid coolant for absorbing heat through the shared bulk header. In particular, the combined embedded heat exchanger manifold 841 rejects heat within shared node enclosure 807 such as node 802c to a secondary liquid coolant. Internal node supply 844 and return conduits 846 of a manifold built on top of a heat exchanger core allow heat transport within manifold 841. In one embodiment, closed system pump 898 can use a first coolant to cool a high thermal energy generating functional component such as a CPU or voltage regulator.

Additionally, the liquid cooling subsystem 822 also includes a filtration system or unit 871, which prevents chemical impurities and particulates from clogging or otherwise damaging the conduits as the fluid passes through the network of conduits. According to one aspect of the disclosure, liquid cooling subsystem 822 provides RFU 871 in fluid connection with the intake pipes from facility supply 828. In at least one embodiment, RFU 871 includes a sequenced arrangement of liquid filters within a full-sized sled that can be removably inserted by an end user into one of the receiving slots of rack 804. In one embodiment, the RFU 871 is located on an infrastructure sled having rack-level controllers and other rack-level functional components. In at least one embodiment, the entirety of the sled is filed with components associated with RFU 871. Thus, it is appreciated that the RFU 871 may occupy the entire area of one vertical slot/position within the chassis. Alternate locations of the RFU 871 can also be provided, in different embodiments, with an ideal location presenting the intake port of the RFU 871 in close proximity to a connection to facility supply 828 to directly receive the facility supply 828 prior to the liquid being passed into the remainder of the conduits of the liquid cooling subsystem 822. It is appreciated that if the system was capable of completing all heat exchange within the rack, then sealing the rack would be feasible and would reduce and/or remove any requirements for filtration and/or allocation of rack space for RFU 871.

Liquid cooled compute systems use the high heat transport capacity of water. However, the disclosure recognizes and addresses the fact that with liquid introduced into an electronic enclosure, there is a potential for leaks that can cause catastrophic system failure. Also, in some instances, a leak can create an electronic short with a resulting exothermal reaction causing permanent damage to the DL RIHS 800. To mitigate such risks, as one design feature, node-level HDD carrier or leak containment barrier 893 can include a trench/gutter system or trough 894. In one embodiment, the gutter system can also incorporate an absorbent material that can accumulate sufficient amounts of liquid from small leaks to enable external sensing of the leak. Advantageously, the leak containment barrier 893 can also be thermally conductive to serve as a heat sink for components such as storage devices 808. In one embodiment, another leak detection solution that can be incorporated into the LC node 802 involves use of a solenoid to create an event when additional current is applied, due to water pooling around the solenoid. Barriers on leak containment barrier 893 can be specifically designed to contain a liquid leak and assist in funneling the liquid through the gutter system. Liquid rail 824 can also be provided with leak containment and detection. In one or more embodiments, removable pipe covers 876 are sized to be mounted around respective MLD conduits 878a-878b and can include liquid sensors 897 for automatic alerts and shutdown measures.

In one or more embodiments, DL RIHS 800 further incorporates a node-level liquid containment structure 803 with a cascading drain runoff tubing network 896 to a rack-level cascading liquid containment structure 895. In one or more embodiments, the DL RIHS 800 further incorporates leak detection command such as partial or complete automated emergency shutdown. Liquid sensors (LS) 897 at various cascade levels can identify affected portions of DL RIHS 800. Containment and automatic shutoff can address the risks associated with a leak developing in the DL cooling system 822.

Figure 9:
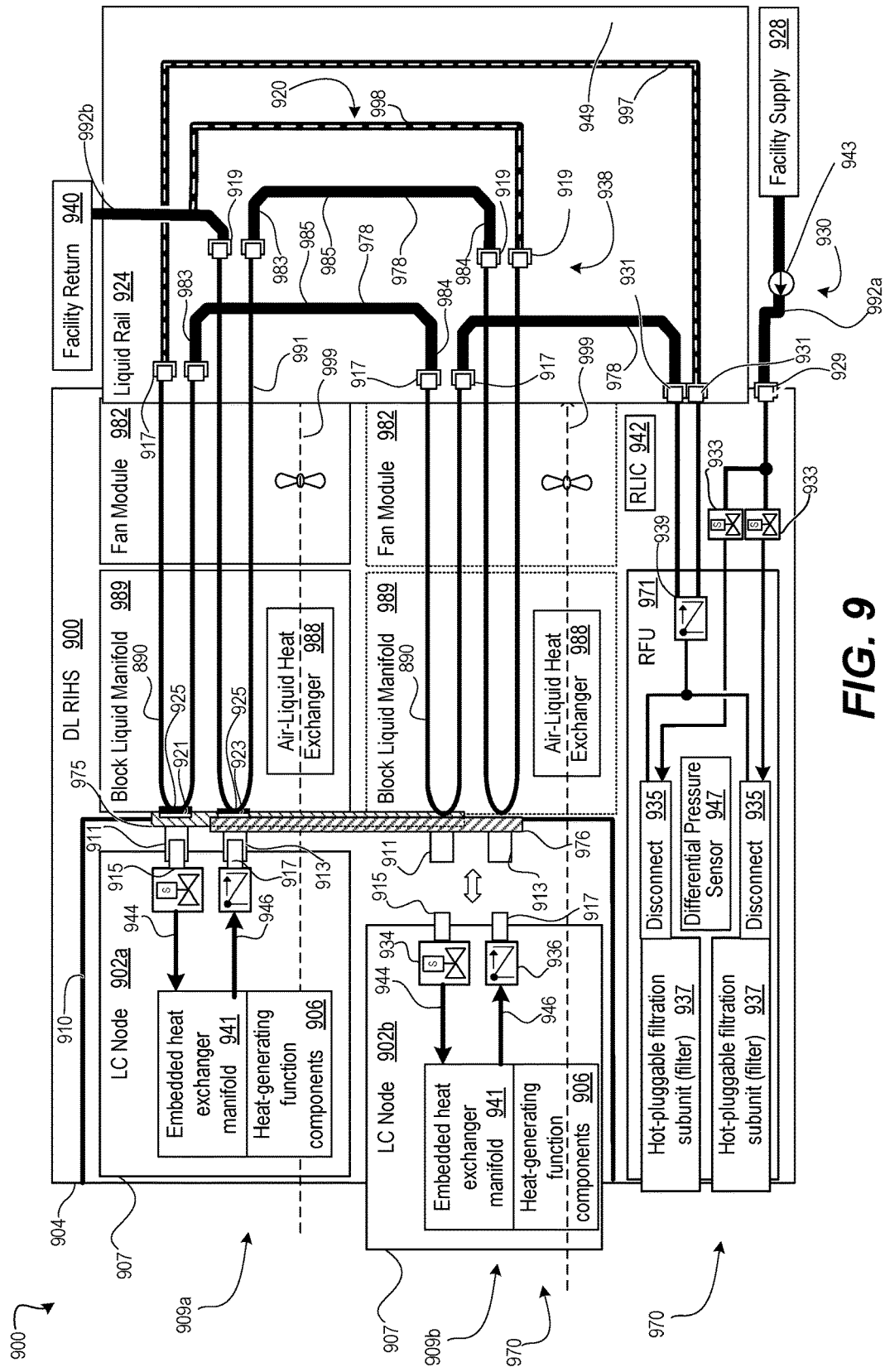
FIG. 9 illustrates an expanded, more detailed view of the liquid interconnection between the node level heat exchange manifold, the block liquid manifold containing the air-liquid heat exchanger, and example MLDs of the liquid rail, according to multiple embodiments.

FIG. 9 illustrates a more detailed view of DL subsystem 920 associated with example DL RIHS 900. Within DL RIHS 900, each LC node 902a, 902b includes chassis 910 received in a respective chassis-receiving bay 970 of rack 904. Each LC node 902a, 902b contains heat-generating functional components 906. Each LC node 902a, 902b is configured with a system of internal supply conduit 944 and return conduit 946, associated with embedded heat exchanger manifold 941. Embedded heat exchanger manifold 941 receives direct intake/flow of cooling liquid to regulate the ambient temperature of LC node 902a, 902b. A node-level dynamic control valve 934 and node-level return check valve 936 control an amount of normal flow and provide shutoff and/or otherwise mitigate a leak. Cooling subsystem 920 provides cooling to heat-generating functional components 906 inside the LC node 902a, 902b by removing heat generated by heat-generating functional components 906. Liquid rail 924 is formed from more than one node-to-node, MLD conduit 978 between more than one LC node 902a, 902b within in rack 904. MLD conduits 978 includes first terminal connection 983 and second terminal connection 984. First terminal connection 983 and second terminal connection 984 are attached on opposite ends of central conduit 985. Central conduit 985 is rack-unit dimensioned to directly mate and seal to and enable fluid transfer between a selected pair of rail supply ports 917 and/or rail return ports 919 of a selected LC node 902a and an adjacent LC node 902b.

The cooling subsystem 920 includes block liquid manifolds 989 mountable at a back side of the rack 904. Each block liquid manifold has at least one rail supply port 917 and at least one rail return port 919 on an outside facing side of the block liquid manifold 989. The at least one rail supply port 917 and the at least one rail return port 919 respectively communicate with at least one block supply port 921 and a block return port 923 on an inside facing side of the block liquid manifold 989. LC nodes 902 are insertable in receiving bays 970 of rack 904 corresponding to locations of the mounted block liquid manifolds 989. Block supply ports 921 and block return ports 923 of the LC nodes 902 and an inside facing portion of the corresponding block liquid manifold 989 are linearly aligned. The linear alignment enables direct sealing, for fluid transfer, of the lineally aligned inside manifold supply ports 925 and return ports 927 to the inside facing portion of the block liquid manifold 989. In one or more embodiments, block supply port 921 sealed to the internal manifold supply port 925 communicates via supply bypass tube 990 to two rail supply ports 917. Block return port 923 sealed to internal manifold return port 927 communicates via return bypass tube 991 of the respective block liquid manifold 989 to two rail return ports 919. Fan modules 982 mounted respectively onto back of block liquid manifold 989 have apertures to expose rail supply and return ports 917, 919. Additionally, fan modules 982 draw hot air 999 from LC nodes 902 through an air-liquid heat exchanger 988 in block liquid manifold 989.

In one or more embodiments, supply liquid conduit 992a is attached for fluid transfer between facility supply 928 and rail supply port 917 of block liquid manifold 989 of RIHS 900. A return liquid conduit 992b can be attached for fluid transfer between rail return port 919 of block liquid manifold 989 and facility return 940. FIG. 9 further illustrates that the fluid connection to facility supply 928 includes RFU 971. To prevent contamination or causing damage to cooling subsystem 920, RFU 971 is received in bay 970 of rack 904 and includes one of two input ports 929 connected via supply liquid conduit 992a to facility supply 928. The RFU 971 includes one of two output ports 931 that is connected to MLD conduit 978 of supply rail conduit 930. Liquid rail 924 also includes return rail conduit 938. RFU 971 controls two external emergency shutoff valves 933 for flow received from the input port 929 that is provided respectively via hot-pluggable disconnects 935 to two replaceable filtration subunits ("filters") 937. The flow of cooling liquid flows in parallel to two replaceable filtration subunits 937, automatically diverting to the other when one is removed for replacing. Thereby, filtration and cooling of RIHS 900 can be continuous. Back-flow is prevented by check valve 939 that allows normal flow to exit to output port 931. Differential pressure sensor 947 measures the pressure drop across filters") 937 and provides an electrical signal proportional to the differential pressure. According to one aspect, a LINC 942 can determine that one filter 937 is clogged if the differential pressure received from differential pressure sensor 944 falls below a pre-determined value.

In one or more embodiments, RIHS 900 can provide hot-pluggable server-level liquid cooling, an integrated leak collection and detection trough, and an automatic emergency shut-off circuit. At a block level, RIHS 900 can provide embedded air-to-liquid heat exchange, and dynamic liquid flow control. At a rack level, RIHS 900 can provide facility-direct coolant delivery, a scalable rack fluid network, a rack filtration unit, and automated rack flow balancing, and a service mode.

According to one embodiment, liquid rail 924 includes a series of secondary conduits, such as a supply divert conduit 997 and a return divert conduit 998, that provides a by-pass fluid path for each of MLD conduits 978. In operation, divert conduit 997 allows for the removal of corresponding MLD conduit 978, thus removing the flow of cooling liquid to the particular block of nodes, without interrupting the flow of cooling liquid to the other surrounding blocks of computer gear. For example, a particular MLD conduit 978 can be replaced due to a leak. For another example, a block liquid manifold 989 can be replaced. The inclusion of divert conduits 997, 998 thus enables rapid servicing and maintenance of block liquid manifold 989 and/or nodes within block chassis without having to reconfigure the MLD conduits 978. In addition, the RIHS 900 can continue operating as cooling liquid continues to be provided to the remainder of the blocks that are plugged into the liquid rail. Re-insertion of the MLD conduit 978 then reconnects the flow of cooling liquid to the block for normal cooling operations, and shuts off the diverted flow of cooling liquid. In an exemplary embodiment, the MLD conduits 978 provide a quick disconnect feature that interrupts flow when not fully engaged to a respective port 917, 919, 921, 923. Disconnection of an MLD conduit 978 interrupts flow in a primary portion of the liquid rail 924 for either supply or return, shifting flow through one or more divert conduits 997 to provide cooling liquid to the other block liquid manifolds 989. In one or more embodiments, a manual or active shutoff valve can interrupt flow on either or both of the primary or divert portions of the liquid rail 924.

In one or more embodiments, each LC node 902 can receive liquid cooling service from a corresponding block liquid manifold 928 as illustrated by FIG. 9. In one or more embodiments, one or more block liquid manifolds 928 provide liquid cooling service to a block chassis 910 that in turn quick connects to more than one LC node 902a, 902b. A node-receiving liquid inlet port 911 and a node-receiving liquid outlet port 913 are located at the rear section of one node-receiving slot 909a, 909b and positioned to be inwardly facing for blind mating to a node inlet and outlet ports 915, 917 of an LC node 902a, 902b inserted in the one node-receiving slot 909a, 909b. The system of internal supply conduit 944 and return conduit 946 supply cooling liquid through the node enclosure 907. The supply conduit 944 extends from a node inlet coupling 915, which in an exemplary embodiment is a male inlet coupling. The return conduit 946 terminates in a node outlet coupling 917, which in an exemplary embodiment is a male outlet coupling. The node inlet port 915 and the node outlet port 917 are positioned in an outward facing direction at a rear of the node enclosure 907. The node inlet port 915 and the node outlet port 917 are aligned to releasably seal to the respective inlet liquid port and outlet liquid port in the node-receiving slot 909a, 909b, for fluid transfer through the system of conduits 944, 946. A block supply plenum 975 and return plenum 976 can communicate for fluid transfer between the block liquid manifold 989 and each of the supported LC nodes 902a, 902b. Modulation or shutoff of cooling liquid at the block level can also be incorporated into the block supply plenum 975 and return plenum 976.

Figure 10:
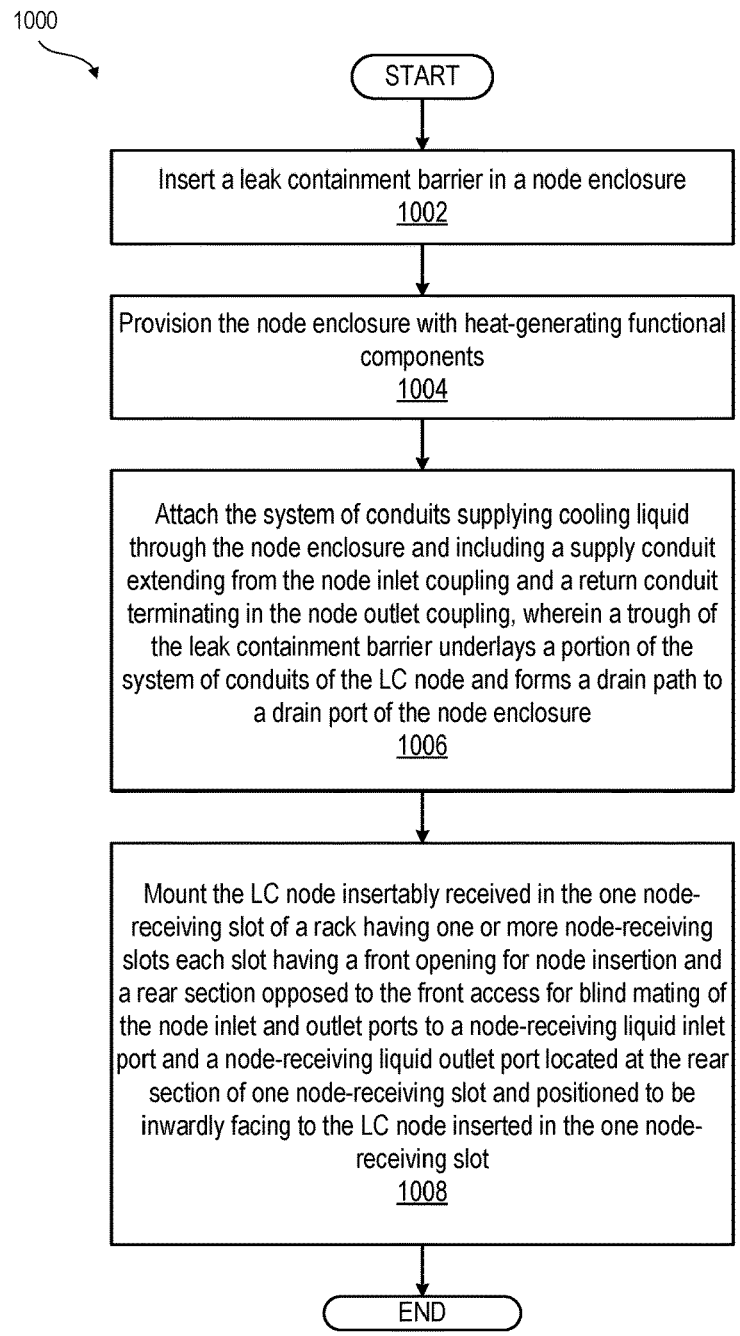
FIG. 10 illustrates a flow diagram of a method of assembling a DL RIHS, according to one or more embodiments.

FIG. 10 illustrates a method 1000 of assembling a DL RIHS. In one or more embodiments, the method 1000 includes inserting a leak containment barrier in a node enclosure (block 1002). The method 1000 includes provisioning the node enclosure with heat-generating functional components (block 1004). The method 1000 includes attaching the system of conduits supplying cooling liquid through the node enclosure. The system of conduits includes a supply conduit extending from the node inlet coupling and a return conduit terminating in the node outlet coupling. A trough of the leak containment barrier underlays a portion of the system of conduits of the LC node and forms a drain path to a drain port of the node enclosure (block 1006). The method 1000 includes mounting the LC node insertably received in the one node-receiving slot of a rack having one or more node-receiving slots. Each slot has a front opening for node insertion and a rear section opposed to the front access for blind mating of the node inlet and outlet ports to a node-receiving liquid inlet port and a node-receiving liquid outlet port located at the rear section of one node-receiving slot. The node-receiving liquid inlet port and the node-receiving liquid outlet port are positioned to be inwardly facing to the LC node inserted in the one node-receiving slot (block 1008). Then method 1000 ends.

Figure 11:
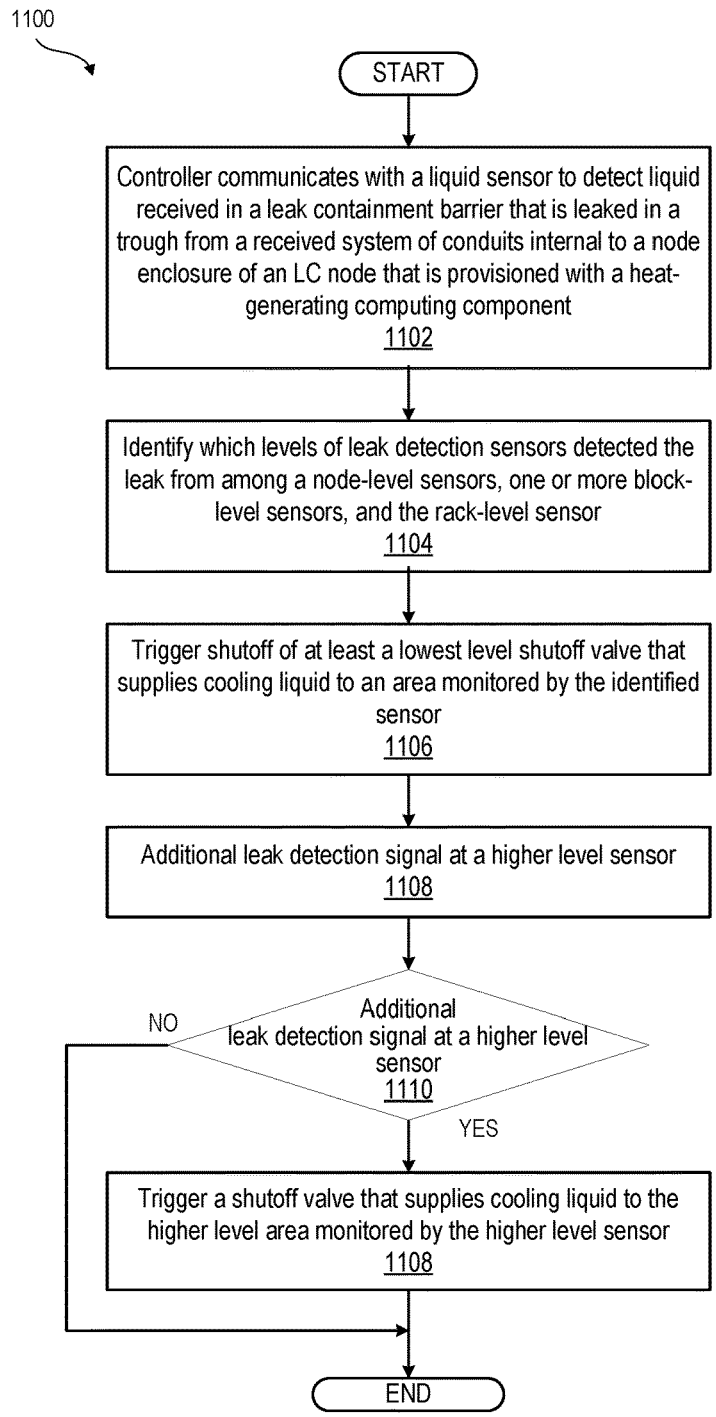
FIG. 11 illustrates a flow diagram of a method of containing leaks in a DL RIHS, according to one or more embodiments.

FIG. 11 illustrates a method 1100 of containing leaks in a DL RIHS. In one or more embodiments, the method 1100 includes a controller communicating with a liquid sensor to detect liquid received in a leak containment barrier that is leaked in a trough from a received system of conduits internal to a node enclosure of an LC node that is provisioned with a heat-generating computing component (block 1102). In one or more embodiments, the method 1100 includes, identifying which levels of leak detection sensors detected the leak from among a node-level sensors, one or more block-level sensors, and the rack-level sensor (block 1104) In an exemplary embodiment, an absorbent material is positioned to absorb and hold at least an initial portion of any liquid that leaks in the leak containment barrier. The node-level liquid sensor is exposed to the absorbent material to detect a presence of liquid within the absorbent material. In response to determining which levels of leak detection sensors detected the leak, method 1100 includes triggering shutoff of at least a lowest level shutoff valve that supplies cooling liquid to an area monitored by the identified sensor (block 1106). The method 1100 includes determining whether the containment solution applied was effective by determining whether an additional leak detection signal is subsequently received at a higher level sensor (decision block 1108). In response to determining the containment solution was effective in decision block 1108, the method 1100 ends. In response to determining the containment solution was not effective in decision block 1108, the method 1100 includes triggering a shutoff valve that supplies cooling liquid to the higher level area monitored by the higher level sensor (block 1110). Then method 1100 ends.

Figure 14:
FIG. 14 illustrates a table data structure of a listing sensor signals with block-level scenarios and block-level leak containment solutions, according to one or more embodiments.

In an exemplary embodiment, the method 1000 can include receiving node (server), block and rack-level sensor signals as listed in Table 1200 in FIG. 12. In an exemplary embodiment, method 1000 can associate the sensor signals with rack-level scenarios and rack-level leak containment solutions as listed in Table 1300 in FIG. 13. In an exemplary embodiment, method 1000 can associate the sensor signals with block-level scenarios and block-level leak containment solutions as listed in Table 1400 in FIG. 14. In an exemplary embodiment, the method 1000 can associate the sensor signals with node-level scenarios and node-level leak containment solutions as listed in Table 1500 in FIG. 1500. In an exemplary embodiment, method 1000 can receive the sensor signals from sensors listed in Table 1600 in FIG. 16.

In the above described flow charts of FIGS. 10-11, one or more of the methods may be embodied in an automated manufacturing system or automated controller that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A Rack Information Handling System (RIHS) comprising:
   a rack having chassis-receiving bays; and
   at least one liquid cooled (LC) node, each comprising a chassis received in a respective chassis-receiving bay of the rack and containing heat-generating functional components, the LC node configured with a system of conduits to receive direct intake/flow of cooling liquid to regulate the ambient temperature of the node and provide cooling to the functional components inside the node by removing heat generated by the heat-generating functional components;
   a liquid rail formed by more than one Modular Liquid Distribution (MLD) conduit connecting for fluid transfer respectively rail supply and return ports of adjacent LC nodes into a rail supply conduit and a rail return conduit;
   wherein the chassis comprises a leak containment barrier configured with a trough that underlays a portion of the system of conduits of the LC node and that forms a drain path to a drain port of the chassis; and
   a leak control subsystem comprising: at least one node-level shutoff valve to interrupt the supply flow of cooling liquid to at least one selected LC node; and a liquid infrastructure manager controller (LIMC) in communication with the at least one node-level shutoff valve.

2. The RIHS of claim 1, wherein the leak containment barrier comprises a storage drive carrier attached to the chassis and which is designed to receive at least one storage drive.

3. The RIHS of claim 1, wherein the leak control subsystem further comprises:
   at least one liquid sensor that detects liquid leaks from the DL subsystem and LC nodes,
   the LIMC in communication with the at least one sensor and triggers a closing of one or more of the at least one node level shutoff valve in response to a corresponding liquid sensor detecting a liquid leak in the RIHS.

4. The RIHS of claim 1, further comprising:
   more than one block liquid manifold mounted to the rack in alignment with respective chassis-receiving bays, each block liquid manifold comprising manifold supply and return bypass tubes that terminate in a pair respectively of rail supply ports and rail return ports and that each communicate with the system of conduits of a corresponding at least one LC node.

5. The RIHS of claim 2, wherein the storage drive carrier comprises vibration absorbing material that mitigates vibrations of a storage drive placed in the storage drive carrier.

6. The RIHS of claim 1, further comprising:
   a direct-interface liquid cooling (DL) subsystem to provide a supply flow of cooling liquid to each of the at least one LC node and to receive a return flow of the cooling liquid from the system of conduits of each of the at least one LC node; and a leak control subsystem comprising a cascading gutter structure of drain conduits originating from each trough of a respective LC node of the RIHS and converging into a collection structure that receives leaked liquid that flows through the cascading gutter structure.

7. The RIHS of claim 1, further comprising:

an absorbent material positioned to absorb and hold at least an initial portion of any liquid that leaks in the leak containment barrier; and a node-level liquid sensor exposed to the absorbent material to detect a presence of liquid within the absorbent material, the node-level liquid sensor in communication with the LIMC;

wherein the node-level liquid sensor transmits a signal identifying detection of the liquid within the absorbent material to the LIMC, and the LIMC provides at least one leak detection command in response to receipt of the signal.

8. A liquid cooled (LC) node of a Rack Information Handling System (RIHS), the LC node comprising:

a chassis configured to be received in chassis-receiving bay of a rack;

at least one heat-generating functional component that generates heat internal to the chassis, which requires cooling;

a system of conduits having an inlet port and an outlet port for connecting to a cooling liquid supply to receive direct contact of cooling liquid to regulate the ambient temperature of the LC node by absorbing and transferring heat from within the node via the cooling liquid;

at least one node-level shutoff valve to interrupt the supply flow of cooling liquid to the LC node;

a leak containment barrier configured with a trough that underlays a portion of the system of conduits of the LC node and that forms a drain path to a drain port of the chassis; and a node-level liquid sensor that detects liquid leaks in the trough structure and which is configured to communicate a signal identifying a presence of a liquid leak to at least one leak controller that triggers the at least one shutoff valve to close in response to receipt of the signal, the node-level liquid sensor comprising a pair of electrical conduits inserted within the absorbent material and separated by a volume of the absorbent material, wherein an electrical current passes from a first conduit to a second conduit only when the absorbent material has absorbed a minimum threshold supply of leaked fluid.

9. The LC node of claim 8, wherein the LC node is designed for use within a direct-contact liquid cooling (DL) RIHS that comprises a DL subsystem to provide a supply flow of cooling liquid to each LC node and to receive a return flow of the cooling liquid from the system of conduits of the at least one LC node.

10. The LC node of claim 9, wherein the system of conduits comprise a node inlet coupling and node outlet coupling and the inlet liquid port and outlet liquid port, respectively, positioned to be inwardly facing for blind mating to a node inlet and outlet ports of LC node inserted in the one node-receiving slot.

11. The LC node of claim 8, further comprising:

the absorbent material positioned to absorb and hold at least an initial portion of any liquid that leaks in the leak containment barrier; and a node-level liquid sensor exposed to the absorbent material to detect a presence of liquid within the absorbent material.

12. The RIHS of claim 8, wherein the node level liquid sensor comprises:

the absorbent material positioned to absorb and hold at least an initial portion of any liquid that leaks in the leak containment barrier.

* * * * *